US012633927B2

(12) United States Patent
Friedman et al.

(10) Patent No.: US 12,633,927 B2
(45) Date of Patent: May 19, 2026

(54) NEAR-LANDAUER REVERSIBLE SKYRMION LOGIC WITH VOLTAGE-BASED PROPAGATION

(71) Applicant: Board of Regents, The University of Texas System, Austin, TX (US)

(72) Inventors: Joseph S. Friedman, Dallas, TX (US); Benjamin W. Walker, Richardson, TX (US); Xuan Hu, San Jose, CA (US); Alexander J. Edwards, Melissa, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 104 days.

(21) Appl. No.: 18/416,395

(22) Filed: Jan. 18, 2024

(65) Prior Publication Data

US 2024/0243748 A1 Jul. 18, 2024

Related U.S. Application Data

(60) Provisional application No. 63/480,374, filed on Jan. 18, 2023.

(51) Int. Cl.
*H03K 19/20* (2006.01)
*H01F 10/32* (2006.01)
*H03K 19/18* (2006.01)
*H10N 52/80* (2023.01)

(52) U.S. Cl.
CPC ......... *H03K 19/20* (2013.01); *H01F 10/3286* (2013.01); *H03K 19/18* (2013.01); *H10N 52/80* (2023.02)

(58) Field of Classification Search
None
See application file for complete search history.

(56) References Cited

U.S. PATENT DOCUMENTS

| | | | | |
|---|---|---|---|---|
| 12,218,668 | B1 * | 2/2025 | Salimath | H03K 19/21 |
| 2016/0314827 | A1 * | 10/2016 | Cros | G11C 11/16 |
| 2019/0074044 | A1 * | 3/2019 | Atulasimha | G11C 11/5607 |
| 2020/0412366 | A1 * | 12/2020 | Friedman | H03K 19/20 |
| 2023/0352109 | A1 * | 11/2023 | Luo | G11C 11/161 |

* cited by examiner

*Primary Examiner* — Crystal L Hammond
(74) *Attorney, Agent, or Firm* — Yee & Associates, P.C.

(57) ABSTRACT

A method for skyrmion based processing is provided. The method comprises generating a number of skyrmions. The skyrmions are moved down a skyrmion racetrack using a multi-phase voltage-controlled magnetic anisotropy (VCMA) clock. A number of logical operations are performed with zero or more skyrmions belonging to the same clock cycle that meet at a logical junction. Outputs of the logical operations fan out to other logic gates for computation of any arbitrary combinatorial function.

20 Claims, 22 Drawing Sheets

GROUND

VOLTAGE 1

VOLTAGE 2

VOLTAGE 3

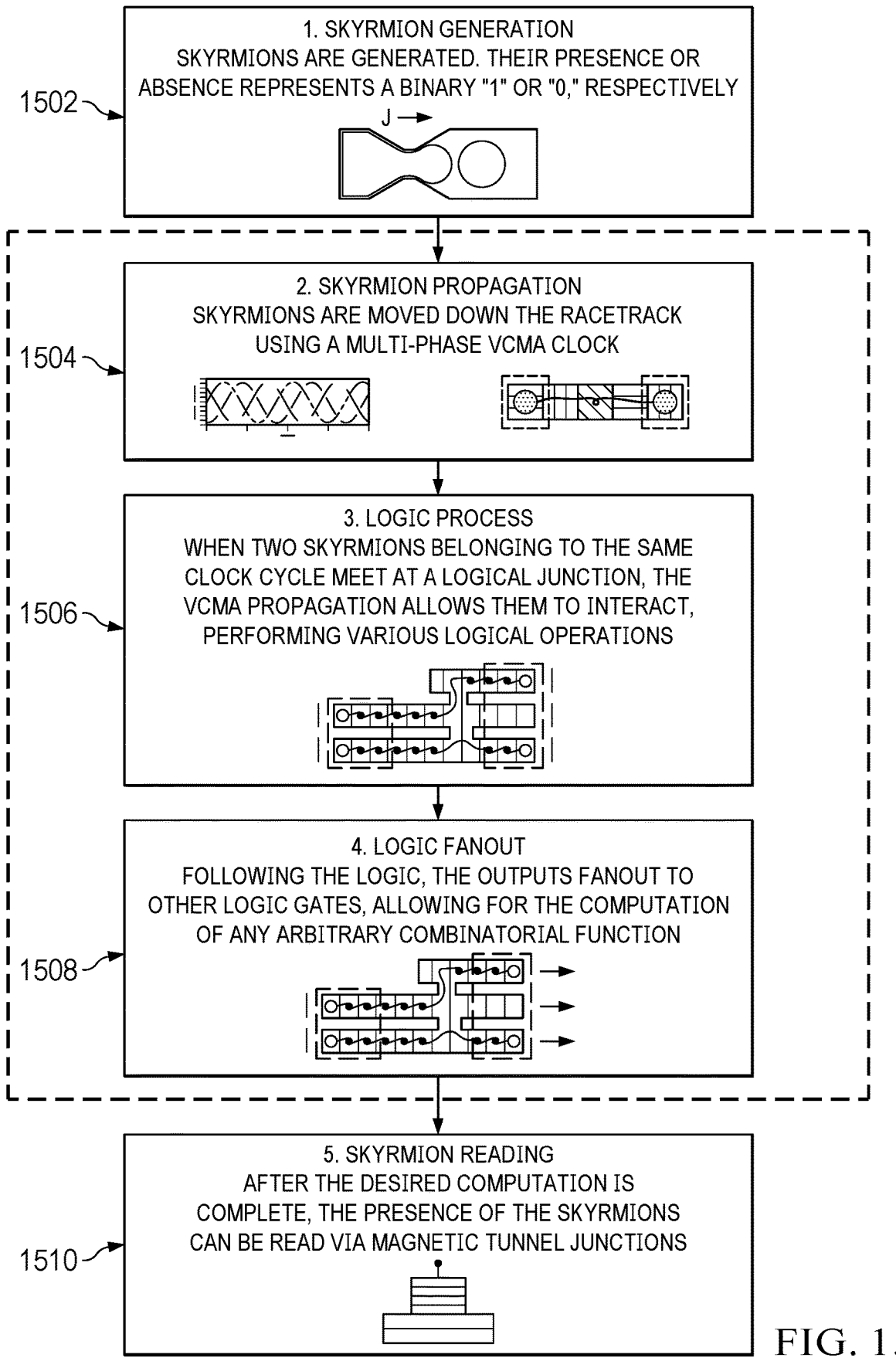

1502 —

1. SKYRMION GENERATION
SKYRMIONS ARE GENERATED. THEIR PRESENCE OR
ABSENCE REPRESENTS A BINARY "1" OR "0," RESPECTIVELY

1504 —

2. SKYRMION PROPAGATION
SKYRMIONS ARE MOVED DOWN THE RACETRACK
USING A MULTI-PHASE VCMA CLOCK

1506 —

3. LOGIC PROCESS
WHEN TWO SKYRMIONS BELONGING TO THE SAME
CLOCK CYCLE MEET AT A LOGICAL JUNCTION, THE
VCMA PROPAGATION ALLOWS THEM TO INTERACT,
PERFORMING VARIOUS LOGICAL OPERATIONS

1508 —

4. LOGIC FANOUT
FOLLOWING THE LOGIC, THE OUTPUTS FANOUT TO
OTHER LOGIC GATES, ALLOWING FOR THE COMPUTATION
OF ANY ARBITRARY COMBINATORIAL FUNCTION

1510 —

5. SKYRMION READING
AFTER THE DESIRED COMPUTATION IS
COMPLETE, THE PRESENCE OF THE SKYRMIONS
CAN BE READ VIA MAGNETIC TUNNEL JUNCTIONS

FIG. 15

NEAR-LANDAUER REVERSIBLE SKYRMION LOGIC WITH VOLTAGE-BASED PROPAGATION

CROSS-REFERENCE TO RELATED APPLICATION

This application claims the benefit of U.S. Provisional Application Ser. No. 63/480,374, filed Jan. 18, 2023, entitled "Near-Landauer Reversible Skyrmion Logic with Voltage-Based Propagation", which is incorporated herein by reference in its entirety.

STATEMENT OF GOVERNMENT SUPPORT

This invention was made with government support under grant no. 1910800 awarded by the National Science Foundation. The government has certain rights in the invention.

BACKGROUND INFORMATION

1. Field

The present invention relates in general to a novel computing system implementing conservative logic based on magnetic skyrmions for improved speed, power consumption, and energy efficiency for next generation computing.

2. Background

There is a fundamental minimum quantity of energy dissipated by a logic gate in which information-carrying signals are repeatedly created and destroyed. Reversible computing aims to circumvent this limitation by conserving energy as signals propagate through a logic circuit. In this scheme, conservative logical operations are executed through dissipation-free elastic interactions among information carriers that conserve momentum and energy.

A recently developed method combines conservative logic experimentally with micron-sized droplets driven through planar computing structures by pressure and magnetism. However, the large dimensions of the information carriers in these demonstrations detract from the system efficiency and limit potential utility. Therefore, a nanoscale information carrier for reversible computing remains elusive.

Magnetic skyrmions are intriguing information carriers for reversible computing due to their small diameter (~20 nm) and the small current required to induce skyrmion motion. These quasiparticles are topologically stable regions of magnetization comprising a central core oriented antiparallel to the bulk of a magnetic structure. Skyrmion motion involves the propagation of magnetization rather than the transport of physical particles and can be induced by the spin-Hall effect through the application of an electrical current. Magnetic skyrmions propagating along ferromagnetic nanowire tracks have been proposed for memory storage and individual logic gates. However, the development of a scalable skyrmion computing system has been impeded by the need to directly cascade skyrmion logic gates without control and amplification circuitry that significantly reduces the computing system efficiency. In addition, previous proposed skyrmion logic required the continual creation and annihilation of skyrmions, which is an energetically expensive process that requires an external control system.

Therefore, it would be desirable to have an apparatus and system that take into account at least some of the issues discussed above, as well as other possible issues.

SUMMARY

An illustrative embodiment provides a skyrmion logic gate. The logic gate comprises a first track configured for propagation of magnetic skyrmions and a second track configured for propagation of magnetic skyrmions. A junction links the first and second tracks. A continuous current flows through the logic gate, wherein skyrmions propagate due to the current.

Another illustrative embodiment provides a logic circuit comprising a number of skyrmion logic gates. Each skyrmion logic gate comprises two or more tracks configured for propagation of magnetic skyrmions at least one junction linking multiple tracks together. A continuous current flows through the logic gates, wherein skyrmions propagate due to the current. Output skyrmions from logic gates in the circuit act as input skyrmions for other logic gates in the circuit.

Another illustrative embodiment provides a method of performing logical computations with magnetic skyrmions. The method comprises inputting a number of magnetic skyrmions into a logic gate. The logic gate comprises two or more tracks configured for propagation of magnetic skyrmions and at least one junction linking multiple tracks together. A continuous electrical current is applied through the logic gates, wherein the skyrmions propagate due to the current.

Another illustrative embodiment provides a method for skyrmion based processing. The method comprises generating a number of skyrmions. The skyrmions are moved down a skyrmion racetrack using a multi-phase voltage-controlled magnetic anisotropy (VCMA) clock. A number of logical operations are performed with zero or more skyrmions belonging to the same clock cycle that meet at a logical junction. Outputs of the logical operations fan out to other logic gates for computation of any arbitrary combinatorial function.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 15 illustrates a process flow for skyrmion based processing and reading in accordance with an illustrative embodiment;

DETAILED DESCRIPTION

Figure 1:
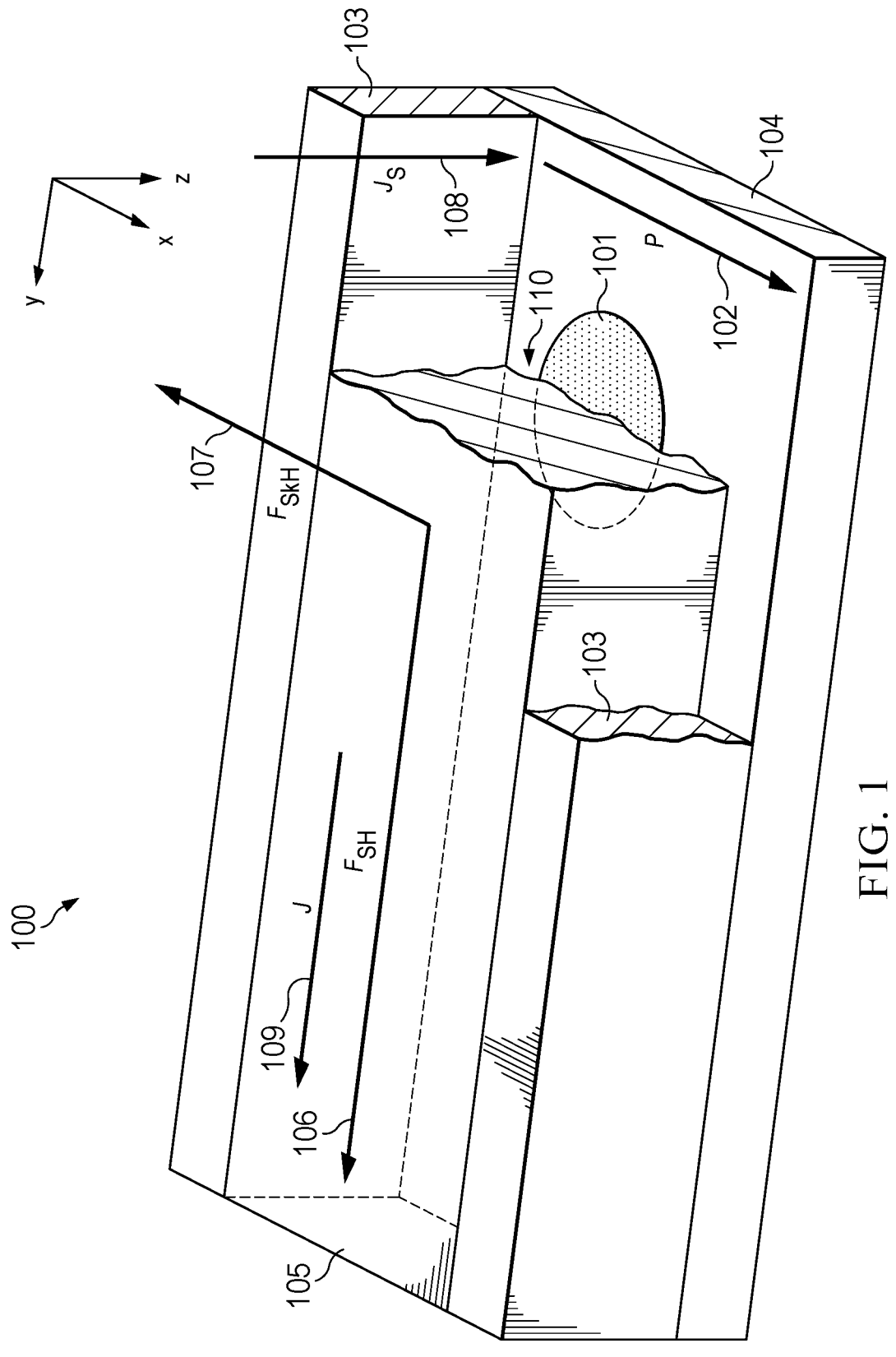
FIG. 1 illustrates skyrmion propagation along a track with which illustrative embodiments can be implemented.

The illustrative embodiments recognize and take into account one or more different considerations. The illustrative embodiments recognize and take into account that magnetic skyrmions are topological quasiparticles whose non-volatility, detectability, and mobility make them exciting candidates for low-energy computing. Previous works have demonstrated the feasibility and efficiency of current-driven skyrmions in cascaded logic structures inspired by reversible computing. As skyrmions can be propelled through the voltage-controlled magnetic anisotropy (VCMA) effect with much greater efficiency, the illustrative embodiments provide a VCMA-based skyrmion propagation mechanism that drastically reduces energy dissipation. Additionally, we demonstrate the functionality of skyrmion logic gates enabled by our novel voltage-based propagation and estimate its energy efficiency relative to other logic schemes. The minimum dissipation of this VCMA-driven magnetic skyrmion logic at 0 K is found to be ~6× the room-temperature Landauer limit, indicating the potential for sub-Landauer dissipation through further engineering.

The illustrative embodiments recognize and take into account that as transistor scaling approaches its ultimate limits, alternative computing paradigms are being explored that circumvent the challenges of conventional computing systems. In particular, reversible computing provides an approach for information processing with zero energy dissipation. However, previous theoretical and experimental implementations of reversible computing use information carriers that cannot be transported in a scalable and efficient manner.

The illustrative embodiments also recognize and take into account that conventional information carriers are not energy efficient. The illustrative embodiments also recognize and take into account that the size of conventional information carriers is limited and not desirable.

As used herein, "magnetic skyrmion" or "skyrmion" refers to topologically non-trivial spin textures with integer topological charges that occur in helimagnetic materials in which broken inversion symmetry can give rise to the Dzyaloshinskii-Moriya interaction.

The disclosed skyrmion logic system of the illustrative embodiments provides a nanoscale solution to the challenge of reversible computing, which enables large-scale logic circuits with minimal energy dissipation.

The illustrative embodiments provide a reversible skyrmion logic system in which skyrmions are conserved as they flow through nanowire tracks. The skyrmions do not disintegrate or disappear from the system over time and may enter, propagate through, remain in a stable track position, or exit many tracks over time. Logical operations are performed by thoroughly leveraging the rich physics of magnetic skyrmions, for example, the spin-Hall effect, the skyrmion-Hall effect, skyrmion-skyrmion repulsion, repulsion between skyrmions and the track boundaries, and electrical current-control of notch depinning.

Binary information may be encoded by the presence ('1') or absence ('0') of magnetic skyrmions, with the skyrmions flowing directly from the output nanowire track of one logic gate to the input track of another logic gate without an external control or amplification circuit. These reversible skyrmion logic gates may provide fan-out functions and be integrated into a large-scale system, with signal integrity provided by simple electronic clock pulses applied to the entirety of the system. The logic-in-memory computing system of the illustrative embodiments may be non-volatile due to the topological stability and ferromagnetic nature of skyrmions, providing efficient pipelining that enhances the potential for high speed and low power.

Micromagnetic simulations are performed using mumax3, an open-source GPU-accelerated micromagnetic simulation software, which integrates the Landau-Lifshitz-Gilbert (LLG) equation of motion with a Finite Difference approach. The sample may be discretized into cuboid cells whose dimensions were set to 1 nm×1 nm×0.4 nm, and the thermal fluctuations may be neglected by setting the temperature to 0K.

The LLG equation of motion describes magnetization dynamics in ferromagnetic materials:

$$\frac{\partial M}{\partial t} = -\gamma(M \times H_{\mathit{eff}}) + \frac{\alpha}{M_s}\left(M \times \frac{\partial M}{\partial t}\right) + \tau_{CPP} \quad (1)$$

where M is the magnetization vector, $\gamma$ is the gyromagnetic ratio, $M_s$ is the saturated magnetization, and $\alpha$ is the Gilbert damping parameter. $H_{\mathit{eff}}$ is the effective field which includes exchange, anisotropy, magnetostatic, Dzyaloshinskii-Moriya and external magnetic fields. $\tau_{CPP}$ implements the injection of spin-Hall current perpendicularly to the sample and is described by:

$$\tau_{CPP} = -\beta\epsilon'(M \times m_P) - \frac{\beta}{M_s}(M \times (m_P \times M)) \quad (2)$$

with $m_P$ as the spin-Hall polarization direction and $$\beta = \frac{\theta_{SH}\hbar J}{2M_s e t_{Co,track}},$$

where $\theta_{SH}$ is the spin-Hall angle, e is the electronic charge, J is the electrical current density, and $t_{Co,track}$ is the thickness of the Co track. $\epsilon'$ is the field-like torque, which is here considered to be zero.

Magnetic parameters may be selected to model a multilayer of Pt and Co, with saturation magnetization $M_s$=5.80× $10^5$ A/m, exchange stiffness $A_{ex}$=1.5×$10^{11}$ J/m, Gilbert damping coefficient $\alpha$=0.1, DMI constant $D_{ind}$=3.0×$10^{-3}$ J/m², magneto-crystalline anisotropy constants $Ku_1$=6×$10^5$ J/m³ and $Ku_2$=1.5×$10^5$ J/m³, and spin polarization in the transverse direction $m_P$=(1,0,0). The anisotropy direction points upwards. The spin-Hall angle $\theta_{SH}$ is considered to be equal to 1. The thickness of the Pt layer is $t_{Pt}$=0.4 nm and the thickness of the Co layer varies between $t_{Co,track}$=0.4 nm and $t_{Co,sample}$=0.8 nm elsewhere.

In a fully-reversible skyrmion logic system, skyrmions need only be generated once, at the beginning of the system operation. After these initial skyrmions are generated, they are continually propagated through the logic gates such that the output skyrmions of each conservative skyrmion logic gate are used as the input skyrmions of other conservative skyrmion logic gates. These skyrmions generated at system initialization are therefore sufficient for long-term use of this system, and their non-volatility enables the skyrmions to maintain their states even when the power supply is removed.

Alternatively, ease-of-demonstration as well as optimization of the conventional metrics of speed, power, and delay may require a compromise regarding the conservation of skyrmions. Another approach to skyrmion generation is to continually generate skyrmions at specific points within the system with a dedicated skyrmion generation structure. This may be achieved with homogeneous currents, or with nanosecond electrical current pulses for a device-compatible stripline geometry. This skyrmion generator would generate a skyrmion in each clock cycle, which then can be provided as an input to a particular logic gate where an input skyrmion is always required.

To read the binary outputs of this conservative logic system, it is necessary to detect the presence ('1') or absence ('0') of skyrmions at various points throughout the circuit. While standard magnetic force microscopy imaging can be used to detect skyrmions in a laboratory setting, computing applications require transformation of the skyrmion information into electrical signals. Determination of the presence or absence of a skyrmion at a particular location can be achieved by placing a tunneling barrier and hard ferromagnet above the Co ferromagnet to form a magnetic tunnel junction (MTJ). The magnetoresistance of this MTJ indicates the presence or absence of a skyrmion within the free layer, as the skyrmion modifies the local magnetization within the free layer and therefore the current through the MTJ tunneling barrier.

Each of the skyrmion logic gates in the illustrative embodiments conserves skyrmions by propagating each input skyrmion to an output port. The operation of a complete conservative logic system requires the conservation of skyrmions throughout the system. Every skyrmion transmitted to the output port of a skyrmion logic gate is then used as an input to another skyrmion logic gate.

Skyrmions propagate to several superfluous output ports that contain logical by-products of the computation of the sum and carry-out signals. For example, the full adder logic gate produces the signals A, B, A$\wedge$B, $C_{IN}$, and $C_{IN}\wedge(A\oplus B)$. Because these are by-products of the full adder computation that are not the primary objectives of the full adder circuit, they are therefore available for use in other logic gates.

To enable a reversible system, the skyrmion signals must be able to propagate to other logic gates. As the lateral flow of information through this two-dimensional structure is unidirectional (left-to-right), it is necessary to provide a technique by which skyrmions are provided to the left side of the circuit. This provision of skyrmions can be achieved by using an additional circuit layer, which also enables the interaction-free cross-over of skyrmion tracks. Furthermore, the direction of the spin current can be modified through static or dynamic modulation of the electrical current direction or the ferromagnetic Co magnetization. Moreover, it should be noted that it may be worthwhile to shed the requirement of complete skyrmion conservation in order to maximize the primary metrics of a computing system, for example, energy consumption, processing speed, and area footprint.

FIG. 1 illustrates skyrmion propagation along a track with which illustrative embodiments can be implemented. Skyrmions 101 propagate along a track 100 comprised of a Co Ferromagnet wall 104 and Co Ferromagnet walls 103 with Pt heavy metal 105 between the walls. The Co ferromagnet material has polarization P 102, where an interfacial spin-orbit coupling induces a Dzyaloshinskii-Moriya interaction.

This spin-orbit coupling also causes the externally-applied electrical current (J) 109 flowing through the heavy metal in the +y-direction to create a spin current ($J_S$) 108 polarized in the +z-direction via the spin-Hall effect. The skyrmion 101 lies in the ferromagnetic layer at the interface 110 with the heavy metal 105, and the surrounding ferromagnet walls 103 prevent the skyrmion 101 from leaving the track 100. Spin current 108 in the +z-direction produces a force $F_{SH}$ 106 on the skyrmion 101 in the +y-direction, the direction of electrical current 109. The track constriction prevents the −x-directed skyrmion-Hall force $F_{SkH}$ 107 from influencing the skyrmion trajectory. It should be noted that the axes are inverted for visual clarity; Pt heavy metal 105 is generally below Co ferromagnet wall 104.

Figures 2A, 2B, 2C:
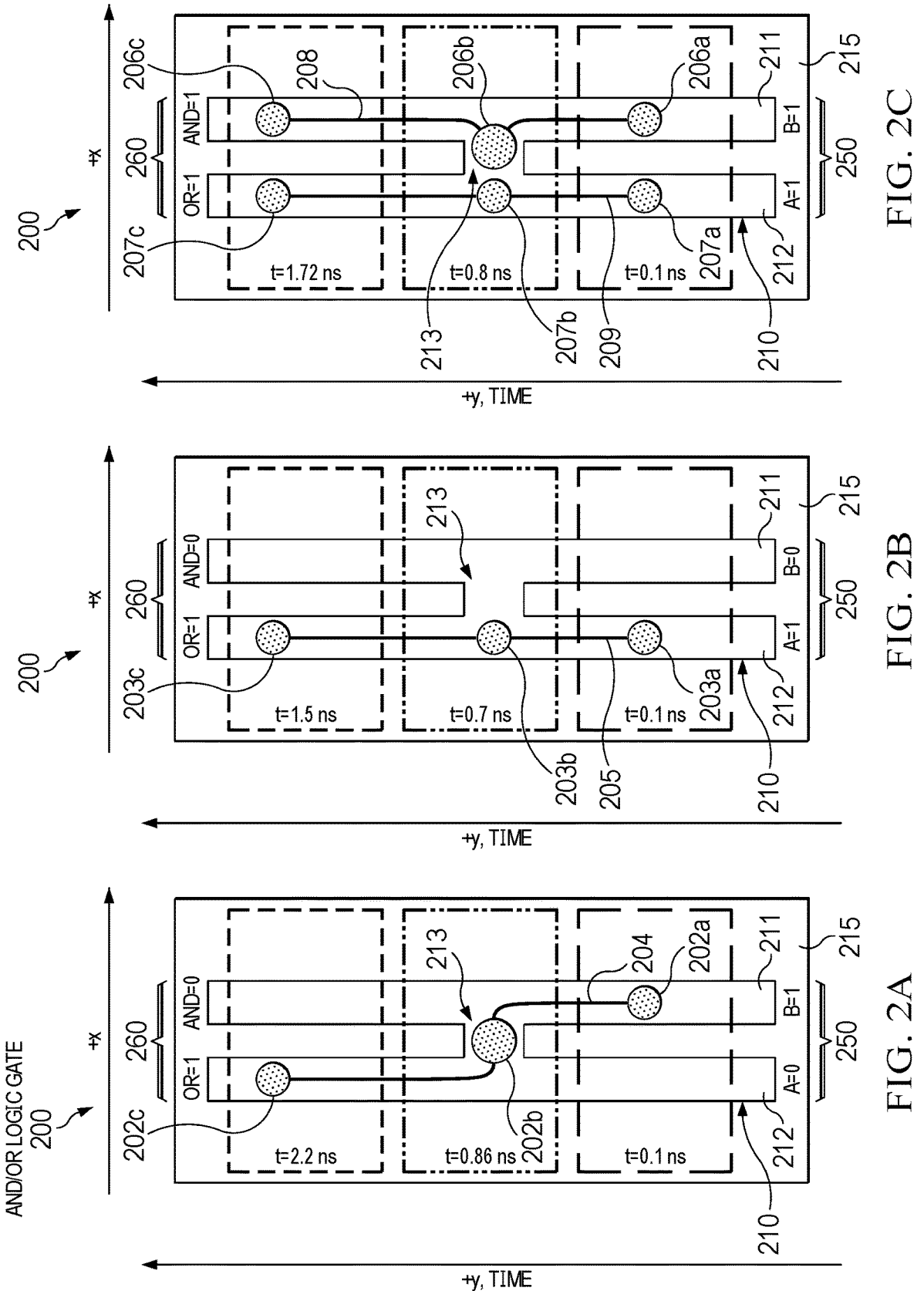
FIG. 2A illustrates skyrmion propagation through a logic AND/OR gate when an input skyrmion is only present in the B track in accordance with an illustrative embodiment.
FIG. 2B illustrates skyrmion propagation through a logic AND/OR gate when an input skyrmion is only present in the A track in accordance with an illustrative embodiment.
FIG. 2C illustrates skyrmion propagation through a logic AND/OR gate and skyrmion-skyrmion repulsion when input skyrmions are present in both tracks in accordance with an illustrative embodiment.

FIGS. 2A-2C illustrate a skyrmion propagation through an AND/OR logic gate in accordance with an illustrative embodiment. The AND/OR logic gate 200 comprises an H-shaped set of tracks 210. FIGS. 2A-2C are top-down views of tracks having structure as indicated in FIG. 1. Set of tracks 210 have input ports 250 and output ports 260. Input ports 250 comprise an A port and a B port in which skyrmions enter the logic gate (input skyrmions), and output ports 260 comprise an OR port and an AND port where skyrmions exit the logic gate (output skyrmions). The set of tracks comprise a right track B 211, a left A track 212, and a central track/junction 213 connecting the tracks 211 and 212. Skyrmion trajectories may change near central junction 213 based on skyrmion-track and skyrmion-skyrmion repulsion. The states of the AND/OR logic gate are shown for different input combinations: A=0, B=1 (FIG. 2A); A=1, B=0 (FIG. 2B); and A=B=1 (FIG. 2C) at the input ports 250. Table 1 is an example truth table for the AND/OR gate, where N is the number of skyrmions in the gate for each logic combination.

TABLE I

Truth table for the AND/OR gate.

| Inputs | | | Outputs | |
|---|---|---|---|---|
| A | B | N | AND | OR |
| 0 | 0 | 0 | 0 | 0 |
| 0 | 1 | 1 | 0 | 1 |
| 1 | 0 | 1 | 0 | 1 |
| 1 | 1 | 2 | 1 | 1 |

FIG. 2A illustrates skyrmion propagation through a logic AND/OR gate when the skyrmion is only provided to the B track 211. The presence of a skyrmion in a track represents a binary 1 in the track at a position and time. When a skyrmion enters the B track 211 of input ports 250 of the AND/OR gate, this logic gate geometry forces the skyrmion to propagate via trajectory 204 to the OR port of output ports 260, representing binary 1. The spin current $J_S$ pushes skyrmions in the +y-direction, with a skyrmion-Hall force directed in the −x-direction. The positions of skyrmions as a function of time are shown as position 202a at t=0.1 ns, position 202b at t=0.86 ns, and positions 202c at about t=2.2 ns. The travel times for the skyrmions, and therefore the position times, may be shown for a constant current J where J=5×10^10 A/m².

In an embodiment, the total number of skyrmions N provided to the inputs A and B are equal to the total number of skyrmions emitted by the AND and OR outputs. The spin-Hall effect pushes the skyrmions in the +y-direction through the tracks, while the skyrmion-Hall effect introduces a −x-directed force that is mediated by repulsion from the track boundaries. The skyrmions are therefore free to move laterally within the central junction, where the skyrmion-Hall effect causes leftward skyrmion propagation unless repulsed by a second skyrmion.

FIG. 2B illustrates skyrmion propagation through a logic AND/OR gate when the skyrmion is only provided to the A track. When a skyrmion enters the A track 212 of input ports 250 of the AND/OR gate, the logic gate geometry forces the skyrmion to propagate via trajectory 205 to the OR port of output ports 260 to represent binary 1. The positions of skyrmion as a function of time are shown as position 203a at t=0.1 ns, position 203b at t=0.7 ns, and positions 203c at about t=1.5 ns. Applying a different current will change the times of each position shown. Since it is confined laterally by the tracks, the input skyrmion travels directly in the +y-direction until it reaches the central junction 213. In the lateral opening of the constrictive tracks at the central junction 213, the skyrmion-Hall force induces a −x-directed component to the skyrmion trajectory that keeps the skyrmion in the A track 212.

FIG. 2C illustrates skyrmion propagation through a logic AND/OR gate and skyrmion-skyrmion repulsion when skyrmions are provided to both tracks. When two skyrmions enter input ports 250, one in A track 212 and one in B track 211, one skyrmion exits the OR output port and the other skyrmion exits the AND output port such that both output ports produce binary 1. Due to skyrmion-skyrmion repulsion at central junction 213, the skyrmion entering track B 211 remains in track B rather than crossing the central junction 213 as in FIG. 2A. The respective positions of the skyrmions as a function of time are shown as position 206a and 207a at t=0.1 ns, position 206b and 207b at t=0.8 ns, and positions 206c and 207c at about t=1.72 ns.

In another embodiment, when no skyrmions enter either input port, no skyrmions are emitted by either output port, representing binary 0 outputs. With skyrmions entering both input ports 250 the combined forces resulting from the spin-Hall effect, the skyrmion-Hall effect, skyrmion-skyrmion repulsion, and the boundaries cause this structure to simultaneously calculate the logical functions A$\lor$B and A$\land$B while conserving the skyrmions.

All input skyrmions that enter a logic gate exit the logic gate as outputs.

Figure 3:
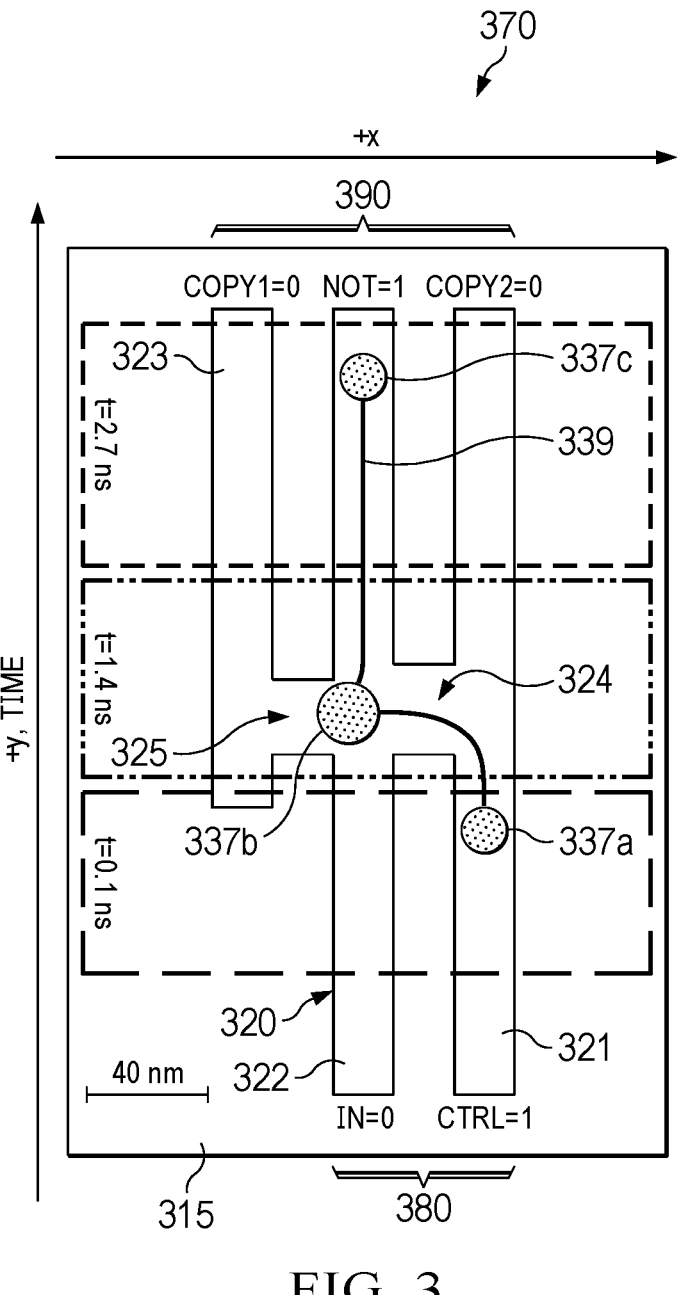
FIG. 3 illustrates an invert/copy logic gate with skyrmion implementation in accordance with an illustrative embodiment.

FIG. 3 illustrates an invert/copy logic gate with skyrmion implementation in accordance with an illustrative embodiment. In concert with the AND/OR gate, the inversion operation enables the generation of all possible Boolean logic functions. Such a logic operation cannot be achieved by the AND and OR operations alone. The INVERT/COPY gate of the illustrative embodiments has an additional output port and the requirement that a skyrmion always be provided to the control (CTRL) input. This reversible INVERT/COPY gate simultaneously duplicates and inverts the skyrmion input signal.

The INVERT/COPY logic gate 370 includes a set of tracks 320, wherein each track has the structure as described in FIG. 1. Tracks 320 have input ports 380 and output ports 390. Input ports 380 comprise an IN port and a CTRL port into which skyrmions enter the logic gate (input skyrmions). Output ports 390 comprise a COPY1 port, a COPY2 port, and a NOT port where skyrmions exit the logic gate (output skyrmions). The set of tracks comprise a right track 321, a middle track 322 and a left track 323. Tracks 321 and 322 are connected by junction 324 near the center of the logic gate. Tracks 322 and 323 are connected by junction 325 also near the center of the logic gate. Skyrmion trajectories may change near the center of the logic gate at junctions 324 and 325 based on skyrmion-track and skyrmion-skyrmion interactions.

In an embodiment, the states of the INVERT/COPY logic gate may be designed to have different input combinations, for example, IN=1 with CTRL=1, or IN=0 with CTRL=1 at the input ports 380. Table 2 is an example truth table for an INVERT/COPY gate.

TABLE II

Truth table for the INV/COPY gate.

| Inputs | | | Outputs | | |
|---|---|---|---|---|---|
| CTRL | IN | N | COPY1 | NOT | COPY2 |
| 1 | 0 | 1 | 0 | 1 | 0 |
| 1 | 1 | 2 | 1 | 0 | 1 |

In FIG. 3, the spin current $J_S$ pushes skyrmions in the +y-direction, with a skyrmion-Hall force directed in the −x-direction. The positions of skyrmions as a function of time are shown as position 337a at t=0.1 ns, position 337b at t=1.4 ns, and positions 337c at t=2.7 ns. The travel times for the skyrmions, and therefore the position times, may be shown for a constant current J where $J=5\times10^{10}$ A/m². A different current may be applied to change the times of each position shown. Since skyrmions are confined laterally by their tracks, the various input skyrmions travel directly in the +y-direction along the various trajectory 339 as shown.

As shown in FIG. 3, when the skyrmion input at the CTRL input reaches junction 324, the skyrmion-Hall force pushes it in the −x-direction into track 322, resulting in an output of COPY1=0, NOT=1, and COPY 2=0.

If skyrmions are input at both input ports 380 wherein IN=1 and CTRL=1 (not shown), the skyrmion-skyrmion repulsion at junction 324 counteracts the skyrmion-Hall force to keep the CTRL input skyrmion in track 321. However, the combination of skyrmion-skyrmion repulsion and skyrmion-Hall forces do push the IN input skyrmion across junction 325 and into track 323, resulting in an output of COPY1=1, NOT=0, and COPY2=1.

Therefore, the NOT output is 1 whenever the IN input is 0, and 0 whenever the IN input is 1. The reversible logic gate may also perform the fan-out function, where skyrmions are conserved such that the IN signal is duplicated to the two COPY outputs. This signal duplication is an essential component of a large-scale computing system and can be performed repeatedly by cascaded INVERT/COPY gates to generate numerous copies of a signal.

Figure 4:
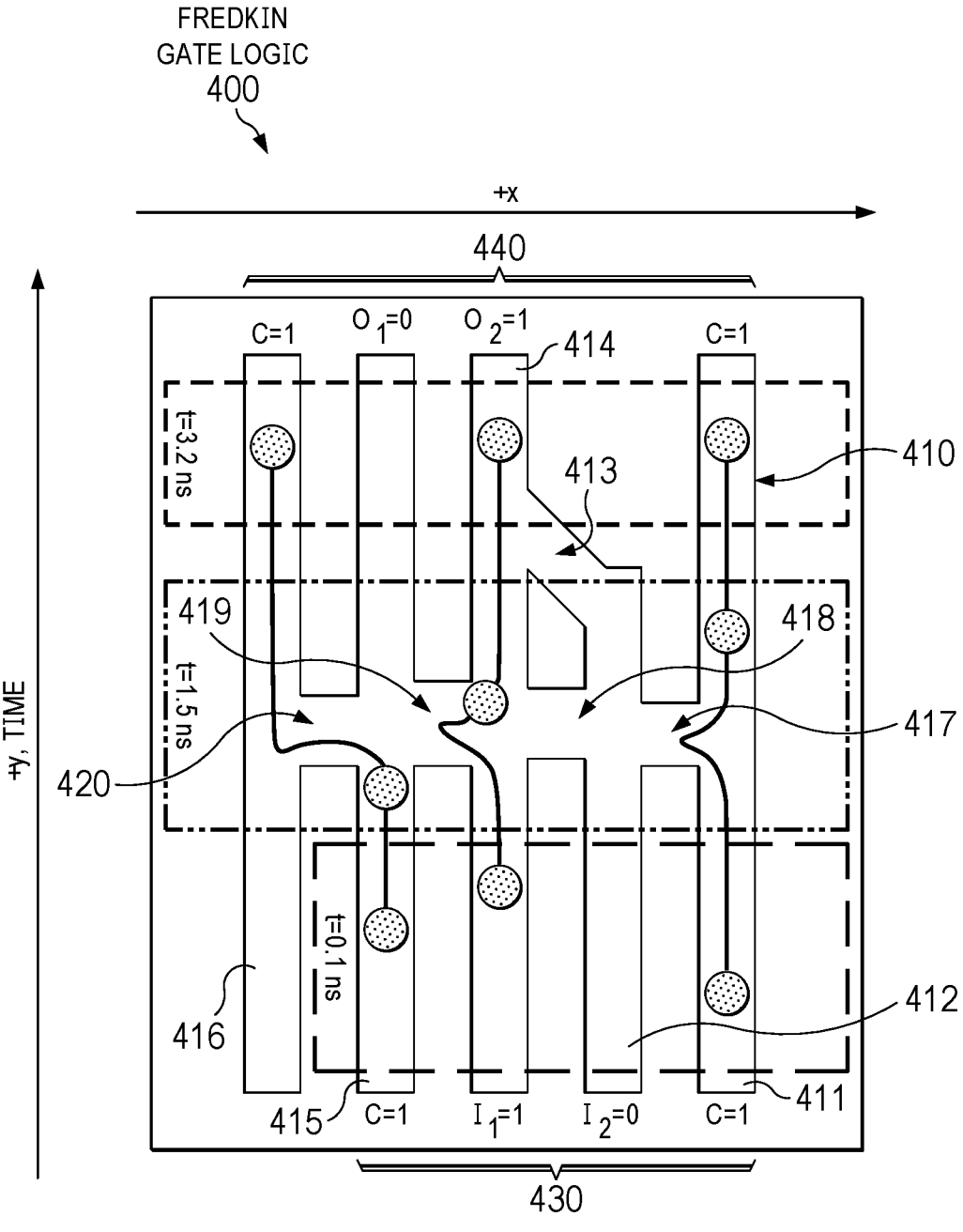
FIG. 4 illustrates a Fredkin gate with skyrmion implementation in accordance with an illustrative embodiment.

FIG. 4 illustrates a Fredkin gate with skyrmion implementation in accordance with an illustrative embodiment. The Fredkin logic gate 400 comprises a set of tracks 410 wherein each track has the structure as described in FIG. 1. The set of tracks 410 comprise a right track 411, a right-middle track 412, a center track 414, a connecting track 413 which connects track 413 to center track 414 at an angle, a left-middle track 415, and left track 416. The tracks 410 further comprise junction 417 connecting track 411 to track 412 near the center of the logic gate, junction 418 connecting track 412 to track 414, junction 419 connecting track 414 to track 415, and junction 420 connecting track 415 to track 416.

Tracks 410 further comprise input ports 430 and output ports 440. Input ports 430 comprise left and right control inputs C, 11, and Is. Skyrmions enter the logic gate (input skyrmions) via input ports 430. Output ports 440 comprise left and right outputs C and outputs $O_1$ and $O_2$. Skyrmions exit the logic gate (output skyrmions) via output ports 440. Skyrmion trajectories may change near the center of the logic gate at the junctions based on the skyrmion-Hall force and skyrmion-skyrmion interactions.

Skyrmions provided to the control inputs C respectively propagate to the C outputs and determine whether or not the $I_1$ and $I_2$ input signals are swapped as they travel to the $O_1$ and $O_2$ outputs. Again, the spin current $J_S$ pushes skyrmions in the +y-direction, with a skyrmion-Hall force directed in the −x-direction.

In the example shown in FIG. 4, the inputs are C=1, $I_1$=1, and $I_2$=0. As a result of skyrmion-skyrmion repulsion, the inputs $I_1$ and $I_2$ swap paths such that $O_1$=$I_2$ and $O_2$=$I_1$. In another example (not shown), when C=0, the input signals $I_1$ and $I_2$ travel directly to the output ports without swapping; that is, $O_1$=$I_1$ and $O_2$=$I_2$. The C signal is duplicated, with both skyrmions at the C input propagating directly to the C output.

Table 3 is an example truth table for a Fredkin logic gate.

TABLE III

Truth table for the Fredkin gate.

| Inputs | | | | Outputs | | |
|---|---|---|---|---|---|---|
| C | $I_1$ | $I_2$ | N | C | $O_1$ | $O_2$ |
| 0 | 0 | 0 | 0 | 0 | 0 | 0 |
| 0 | 0 | 1 | 1 | 0 | 0 | 1 |
| 0 | 1 | 0 | 1 | 0 | 1 | 0 |
| 0 | 1 | 1 | 2 | 0 | 1 | 1 |
| 1 | 0 | 0 | 2 | 1 | 0 | 0 |
| 1 | 0 | 1 | 3 | 1 | 1 | 0 |
| 1 | 1 | 0 | 3 | 1 | 0 | 1 |
| 1 | 1 | 1 | 4 | 1 | 1 | 1 |

In the illustrative embodiments, the output skyrmions emitted by one logic gate are used as input skyrmions for another gate. As the logic gate functionality is based on skyrmion interactions at the central junctions, a synchronization mechanism can be provided to ensure that skyrmions arriving from different input paths reach the central junction simultaneously.

Figure 5:
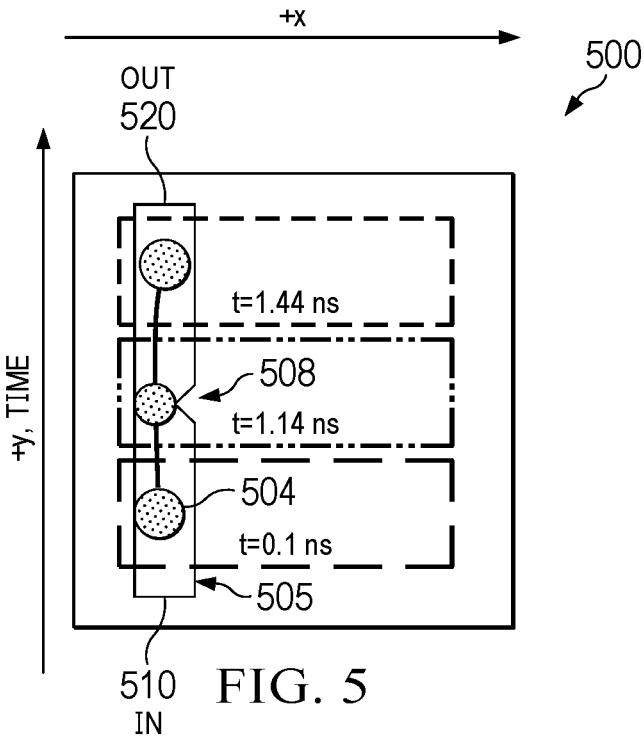
FIG. 5 illustrates a signal synchronization structure in accordance with an illustrative embodiment.

FIG. 5 illustrates a signal synchronization structure in accordance with an illustrative embodiment. A skyrmion track system 500 is shown with an input port IN 510, and an output port OUT 520. Skyrmion 504 enters the track 505 through input port 510 and is shown at different times as it travels along the track in the +y direction. Track 505 includes a notch structure 508 near the center of the track.

In practice, synchronization is achieved with the notch structure 508 which prevents the skyrmion from moving farther down the track unless a large current is applied. A large spin-Hall current pulse enables the skyrmion 504 to traverse the notch 508 by causing a decrease in skyrmion diameter while also increasing the skyrmion velocity.

Figure 6:
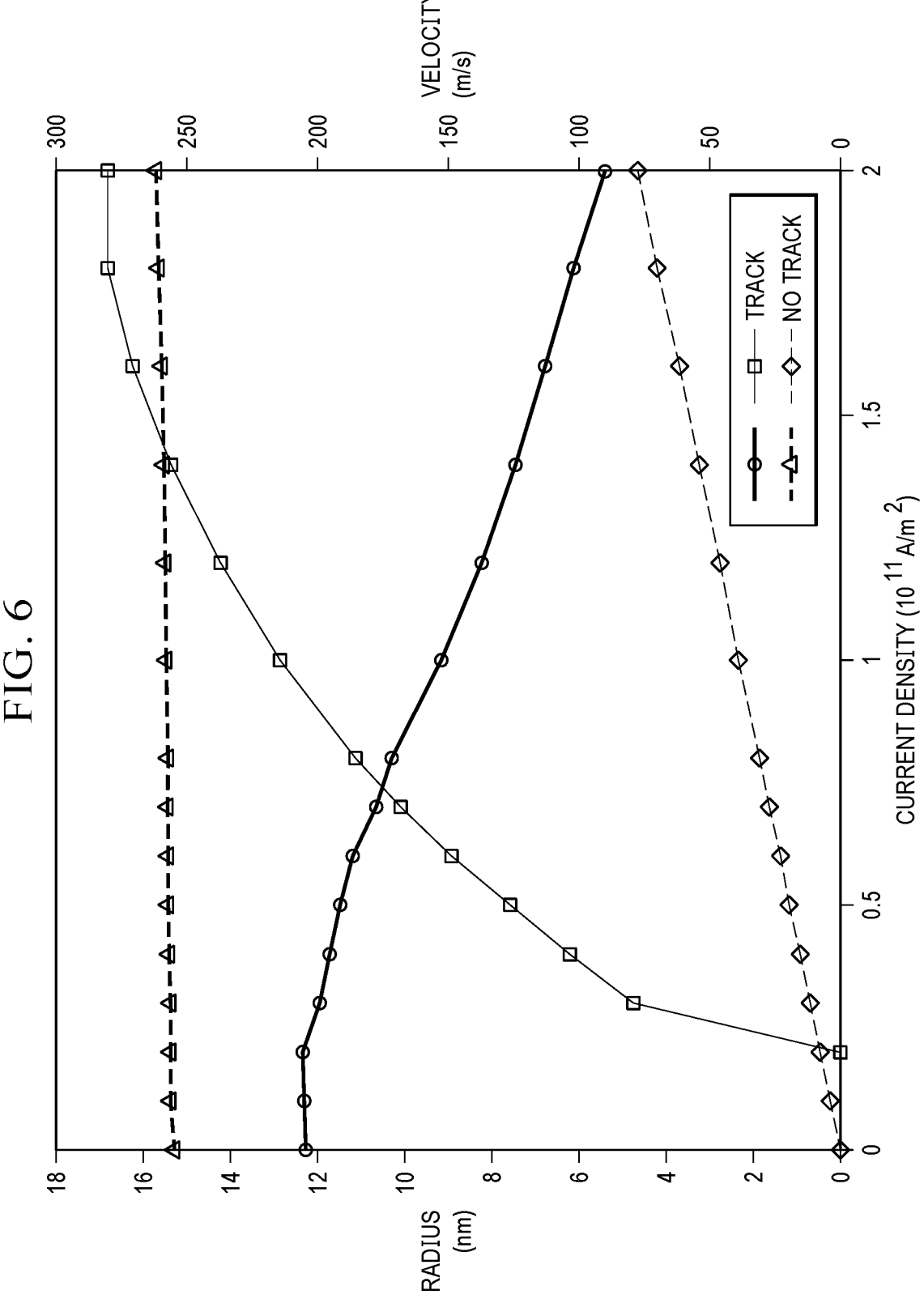
FIG. 6 depicts a graph illustrating skyrmion radius as a function of applied electrical current density in accordance with illustrative embodiments.

FIG. 6 depicts a graph illustrating skyrmion radius as a function of applied electrical current density in accordance with illustrative embodiments.

In an embodiment, the notch 508 may be, e.g., 7 nm wide in a 20 nm-wide nanowire track to create a constriction that permits skyrmion passage only when a large current is applied. The electrical current applied to the entirety of the computing system may maintain a constant low magnitude of $J=5\times10^{10}$ A/m² that is periodically amplified to $J=2\times10^{11}$ A/m² for 150 ps in order to enable skyrmions to traverse notches throughout the system. The skyrmion 504 traverses the notch 508 when this large clock pulse is applied at t=1 ns.

In an embodiment, a small spin-Hall current may be continuously applied to the entire system to propagate the skyrmions through the tracks and logic gate junctions. This current magnitude is below the threshold required for skyrmions to traverse various notches throughout the system. At regular intervals, such as at time t=1.0 ns in the examples shown, a large spin-Hall current pulse is provided to the entire system to drive the skyrmions past the respective notches, which represents the global system clock that synchronizes the computing system. These notch synchronizers may be placed between logic gates, following the output of a logic gate, with the IN port of the notch synchronizer connected to an output port of a logic gate. The OUT port of the notch synchronizer is connected to an input port of a cascaded logic gate. Notches may be inserted between every logic gate input and output where synchronization is required, with each notch synchronizer handling zero or one skyrmion during each clock cycle. The notch synchronizers ensure that the skyrmions are synchronized with one another as they enter each logic gate, thereby providing proper skyrmion-skyrmion repulsion and logical functionality.

In an alternate embodiment, synchronization can be similarly achieved through clocked electrical control of the magnetic anisotropy. For such synchronization based on voltage control of magnetic anisotropy (VCMA), one gate voltage would be continuously applied to a region of a skyrmion track such that skyrmions would not be able to pass that region of the skyrmion track. At regular intervals, a different gate voltage would be applied to this region of the skyrmion track for a brief period of time, enabling a skyrmion to move past this region. In this clocking paradigm, a constant current would be continuously applied to the entire system, and the different gate voltages would be periodically applied to the VCMA synchronizers simultaneously to represent the global clock.

Figure 7:
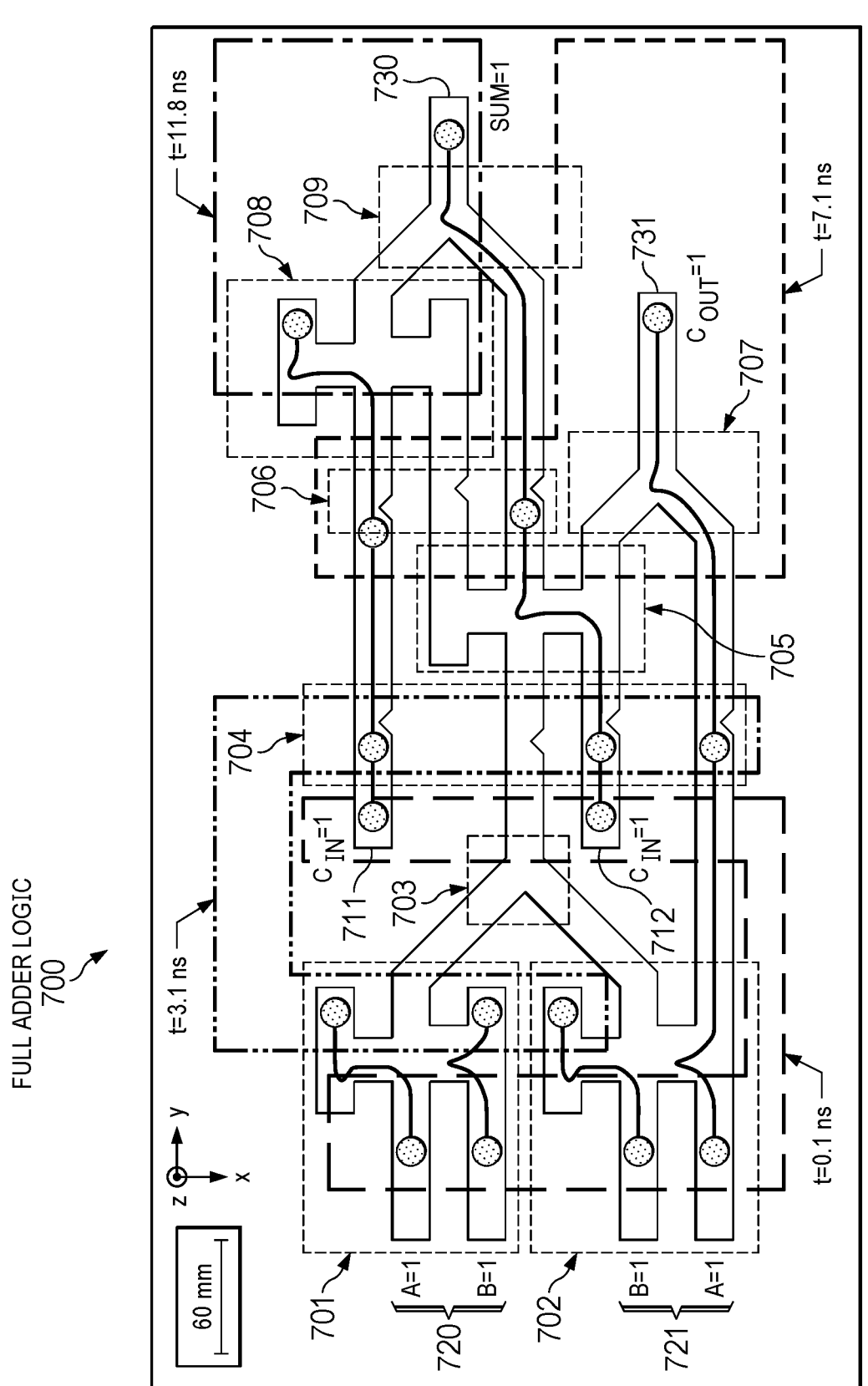
FIG. 7 illustrates a cascaded one-bit full adder logic circuit with skyrmion implementation in accordance with an illustrative embodiment.

FIG. 7 illustrates a cascaded one-bit full adder logic circuit with skyrmion implementation in accordance with an illustrative embodiment. In the present example, one-bit full adder 700 is constructed from the logic gates explained above. One-bit full adder 700 computes the binary sum and carry-out of two one-bit binary numbers A and B and a carry-in bit. Input ports 720 are connected to invert/copy logic gate 701 (B to CTRL and A to IN). Input ports 721 are connected to invert/copy logic gate 702 (A to CTRL and B to IN). The NOT output port of logic gate 701 and the NOT output port of logic gate 702 are merged at a first Y-junction 703. COPY2 output port of logic gate 702 is connected to a second Y-junction 707 through a synchronization notch structure at 704.

Output of Y-junction 703 connects to the input ports of invert/copy logic gate 705 through notch structure 704. $C_{IN}$ input ports 711 and 712 are for the carry-in bit input to the adder. Track 711 connects to an IN port of another invert/copy logic gate 708 through synchronization notch structure 704, and synchronization notch structure 706. Track 712 connects to the CTRL port of invert/copy logic gate 705.

The COPY1 output port of logic gate 705 connects to the CTRL port of invert/copy logic gate 708 through synchronization notch structure 706. The COPY2 output port of logic gate 705 connects to Y-junction 707, which has an output of carry-out port $C_{OUT}$ 731. The NOT output port of invert/copy logic gate 708 is connected to Y-junction 709.

The NOT output of invert/copy logic gate 705 is also connected to Y-junction 709 through synchronization notch structure 706.

The output of Y-junction 709 is the SUM port 730. Full adder functions to sum the inputs A, B, and $C_{IN}$ at the SUM port with the output carry bit registering at the $C_{OUT}$ port.

Integrating the basic logic gates with the cascading and synchronization mechanisms enables the scaling of the reversible computing paradigm to large systems that efficiently perform complex functions. In an embodiment, the input A, B, and carry-in skyrmion signals interact as they propagate through the circuit to produce the sum and carry-out skyrmion signals, thus executing the one-bit full addition function with two half adders.

In an embodiment, a 150 ps-wide clock pulse is provided every 5 ns to synchronize the skyrmions to ensure proper conservative logic interactions within each component logic gate. The sum output may be produced within three clock cycles, while the carry-out output is produced within two clock cycles, and the carry-in to carry-out delay is only one clock cycle.

The clocked skyrmion signals may provide a natural means for pipelining, enabling the execution of n-bit addition within n+2 clock cycles. For example, though the 200 MHz clock frequency and the electrical current magnitudes used in simulation provide inferior efficiency as compared to conventional computing systems, the non-volatility and pipelining inspire a vision for highly-efficient computing with alternative materials and improvements in the Rashba coefficient and spin-Hall angle.

Figure 8:
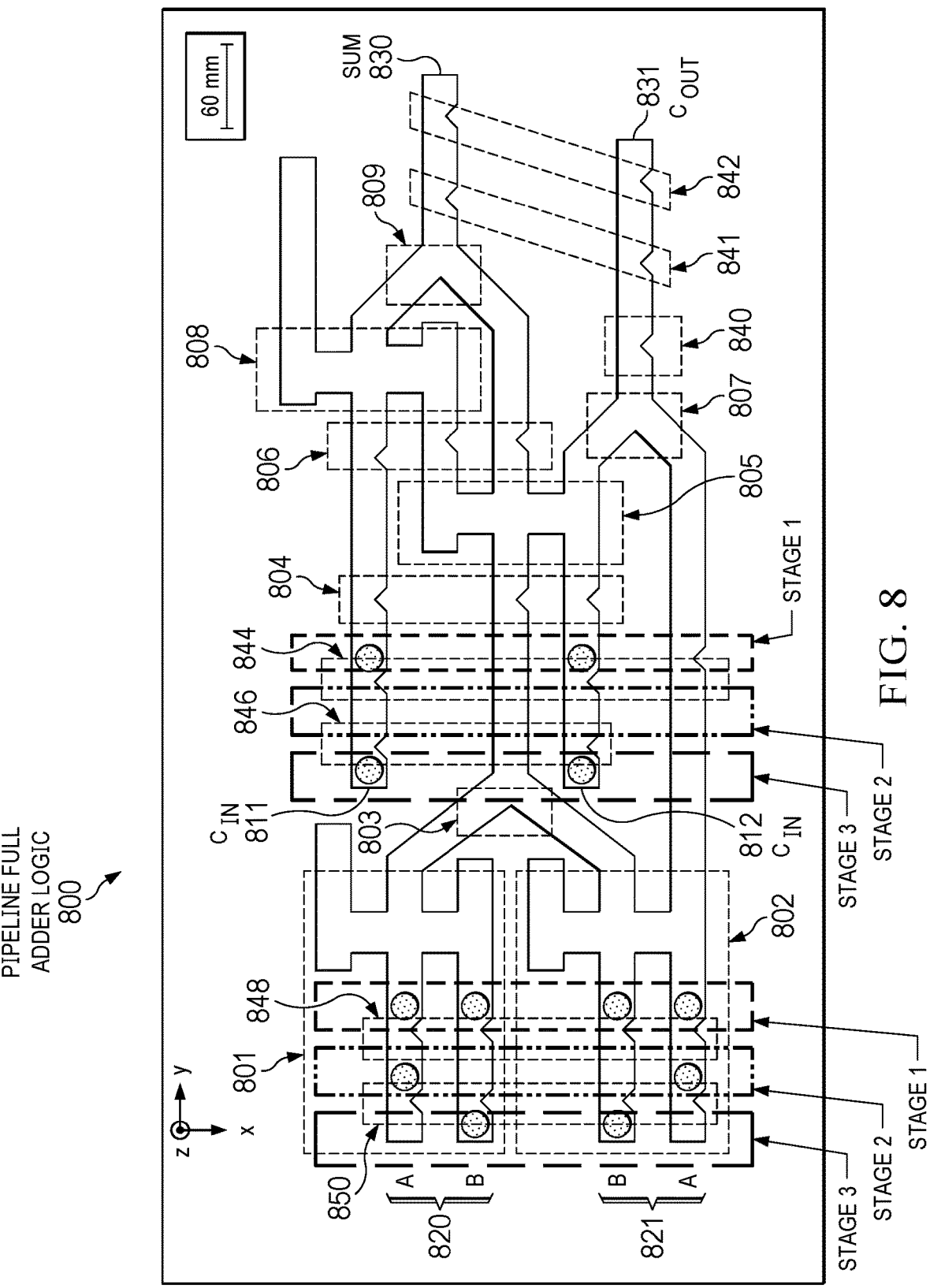
FIG. 8 illustrates a pipelined full adder logic circuit with skyrmion implementation in accordance with an illustrative embodiment.
Figure 9A:
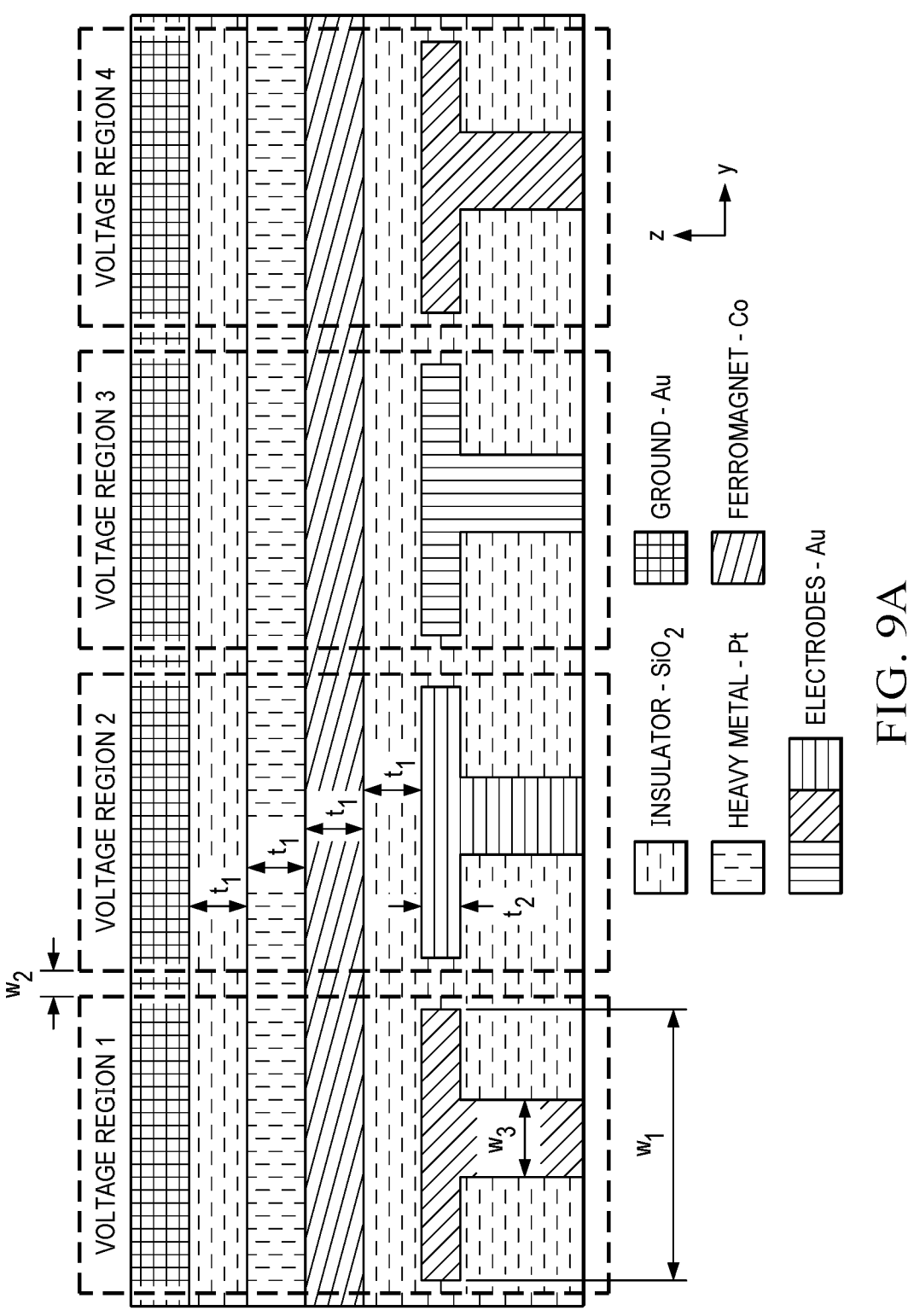
FIG. 9A illustrates a YZ Device Cross Section used in skyrmion propagation wherein an electric field is applied across a heavy metal/ferromagnet interface via electrodes separated by an insulating dielectric.
Figure 9B:
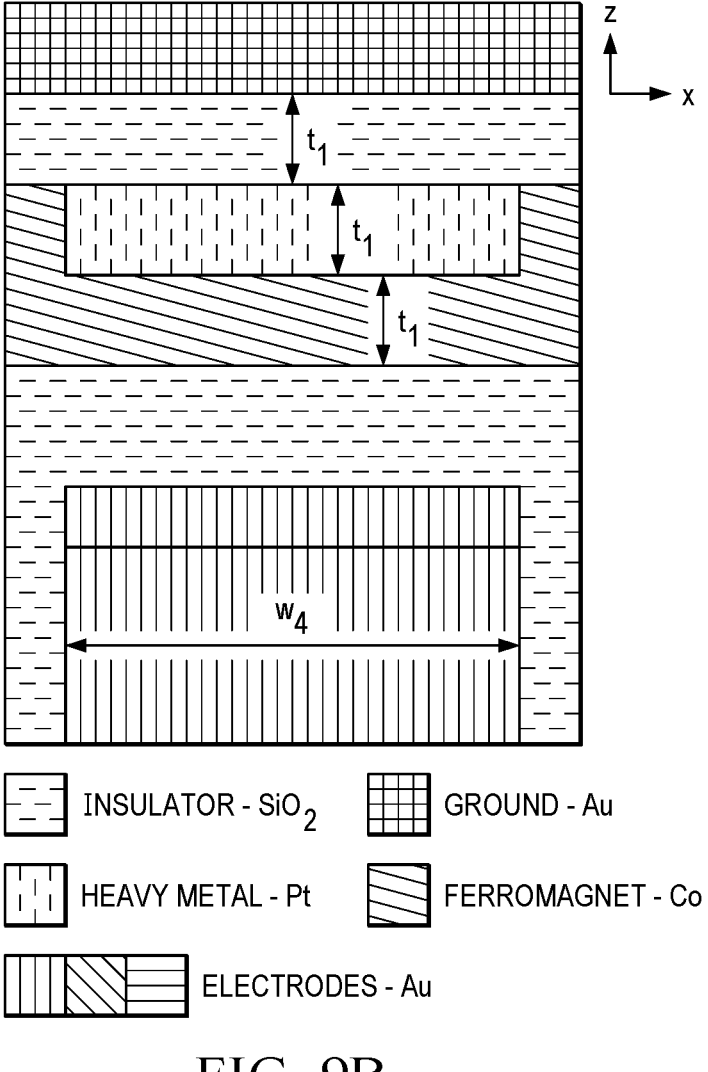
FIG. 9B illustrates XZ Device Cross Section used in skyrmion propagation.
Figure 9C:
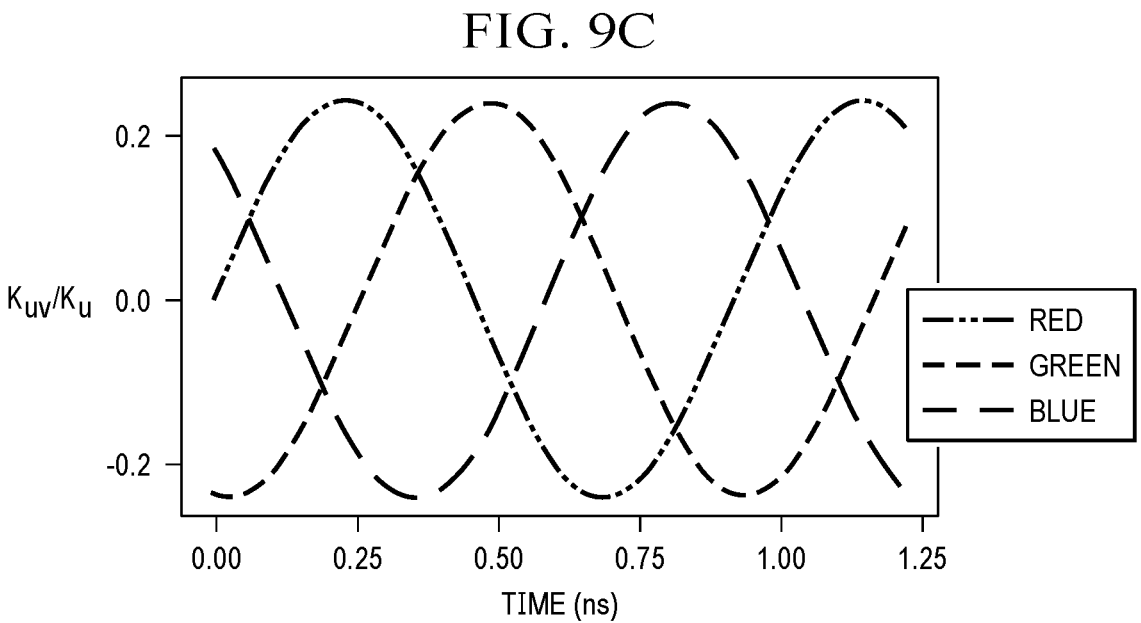
FIG. 9C illustrates VCMA anisotropy waveform applied to electrodes of corresponding shade used in skyrmion propagation.
Figure 9D:
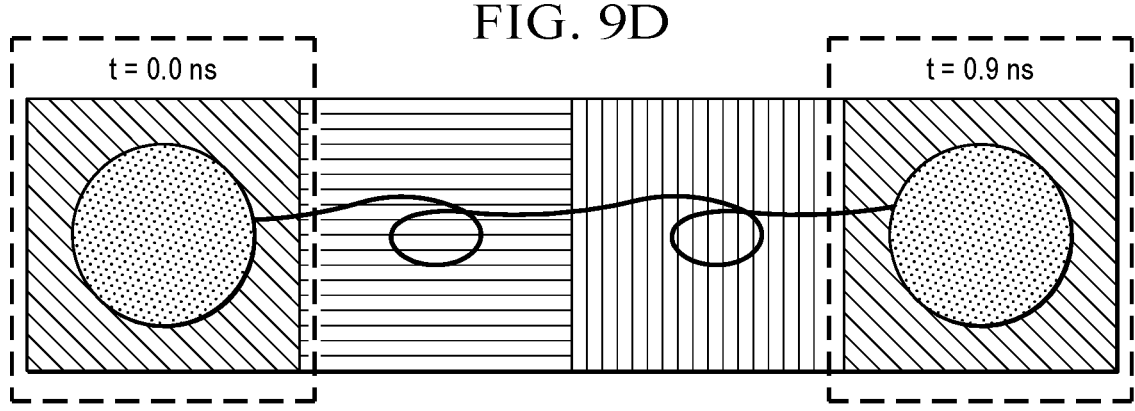
FIG. 9D illustrates micromagnetic simulation of skyrmion propagation.

FIG. 8 illustrates a pipelined full adder logic circuit with skyrmion implementation in accordance with an illustrative embodiment. In the present example, pipelined full adder logic circuit 800 is constructed from clocked full adder structure 700. In an embodiment, the clocking scheme used in the full adder micromagnetic simulation is extended for five cycles to perform three separate full adder operations. Input ports 820 are connected to invert/copy logic gate 801 (B to CTRL and A to IN). Input ports 821 are connected to invert/copy logic gate 802 (A to CTRL and B to IN).

The NOT output port of logic gate 801 and the NOT output port of logic gate 802 are merged at a first Y-junction 803 through a synchronization notch structure at 848 and 850. COPY2 output port of logic gate 802 is connected to a second Y-junction 807 through a synchronization notch structure at 844. Output of Y-junction 803 connects to the input ports of invert/copy logic gate 805 through notch structure 804.

Input $C_{IN}$ ports 811 and 812 are for the carry-in bit input to the adder. Track 811 connects to an IN port of another invert/copy logic gate 808 through synchronization notch structures 844, 846, 804, 806. Track 812 connects to the CTRL port of invert/copy logic gate 805 through synchronization notch structures 844, 846, and 804.

The COPY1 output port of logic gate 805 connects to the CTRL port of invert/copy logic gate 808 through synchronization notch structure 806. The COPY2 output port of logic gate 805 connects to Y-junction 807, which connects to its output of carry-out port $C_{OUT}$ 831 through synchronization notch structures 840, 841, and 842. The NOT output of invert/copy logic gate 805 is also connected to Y-junction 809 through synchronization notch structure 806.

The NOT output port of invert/copy logic gate 808 is also connected to Y-junction 809. Y-junction 809 is connected to its output SUM port 830 through synchronization notch structures 841 and synchronization notch structure 842.

In an example, the pipelined full adder logic circuit 800 may have an initial state of three-stage pipeline at t=0 ns with inputs of A=B=$C_{IN}$=1 for stage one, A=1 and B=$C_{IN}$=0 for stage two, and A=0 and B=$C_{IN}$=1 for stage three. The corresponding final state after five clock cycles at t=24.8 ns would have an output of SUM=$C_{OUT}$=1 for stage 1, SUM=1 and $C_{OUT}$=0 for stage two, and SUM=0 and $C_{OUT}$=1 for stage three.

The non-volatility and energy-efficient mobility of magnetic skyrmions have made them promising candidates for computation. Previous work has utilized skyrmions in a variety of logical devices, and recently skyrmions have emerged as exciting candidates for reversible computing. By conserving information and maintaining logical reversibility in an adiabatic manner, these systems avoid the limits on thermodynamic efficiency intrinsic to traditional computing schemes. Therefore, such reversible computing systems have the potential to outperform the kT ln (2) limit determined by Landauer.

One reversible skyrmion logic system uses a heavy metal/ferromagnet heterostructure to allow for skyrmion stability within the ferromagnet via the Dzyaloshinsky-Moriya interaction. The spin-Hall effect induces skyrmion propagation with applied electronic current, while the skyrmion-Hall effect and skyrmion-skyrmion repulsion produce billiard-ball-like interactions within the logic gates. Skyrmions can be synchronized through voltage-controlled magnetic anisotropy (VCMA) by modulating the perpendicular magnetic anisotropy (PMA) with the application of a voltage on an electrode.

While adiabatic reversible CMOS computing has been well-studied, reversible skyrmion logic gets closer to the Landauer limit by directly implementing the elastic billiard ball model proposed by Fredkin and Toffoli. However, the electrical current required dissipates significant energy. The illustrative embodiments, therefore, provide a new method of skyrmion propagation that uses voltage-controlled magnetic anisotropy (VCMA) to eliminate the need for current-driven propagation, enabling reversible skyrmion computing to achieve near-Landauer energy dissipation.

We propose extremely efficient skyrmion propagation with a three-phase sinusoidal voltage that modulates magnetic anisotropy through VCMA, driving the skyrmions towards regions of lower anisotropy without requiring electrical current. Though previous works modulate PMA periodically in discrete steps, the rapid charging of electrode capacitance results in significant energy dissipation. By using three voltage sinusoids each shifted by $2\pi/3$ radians applied to neighboring electrodes (shown in FIGS. 9A-9D), skyrmions can be controllably propagated.

The magnetic dissipation of this VCMA-driven propagation scheme can be calculated as $$\frac{dE}{dt} = -\frac{\alpha\mu_0}{\gamma_0 M_s}\int_V\left(\frac{dM}{dt}\right)^2 dV.$$

Figure 10A:
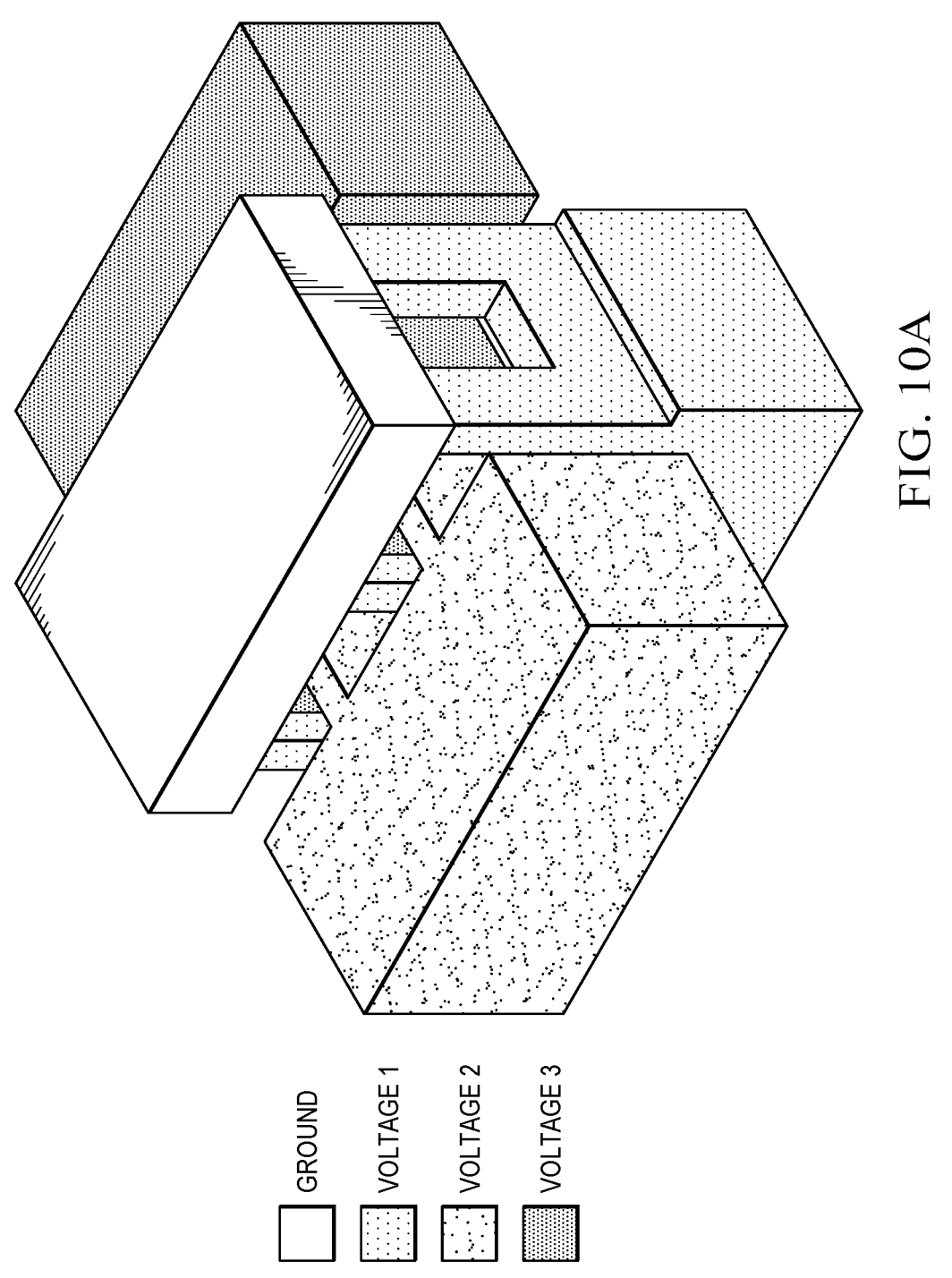
FIG. 10A illustrates a three-dimensional electrical model wherein sinusoidal voltage waveforms are applied to the external face of each volume.
Figure 10B:
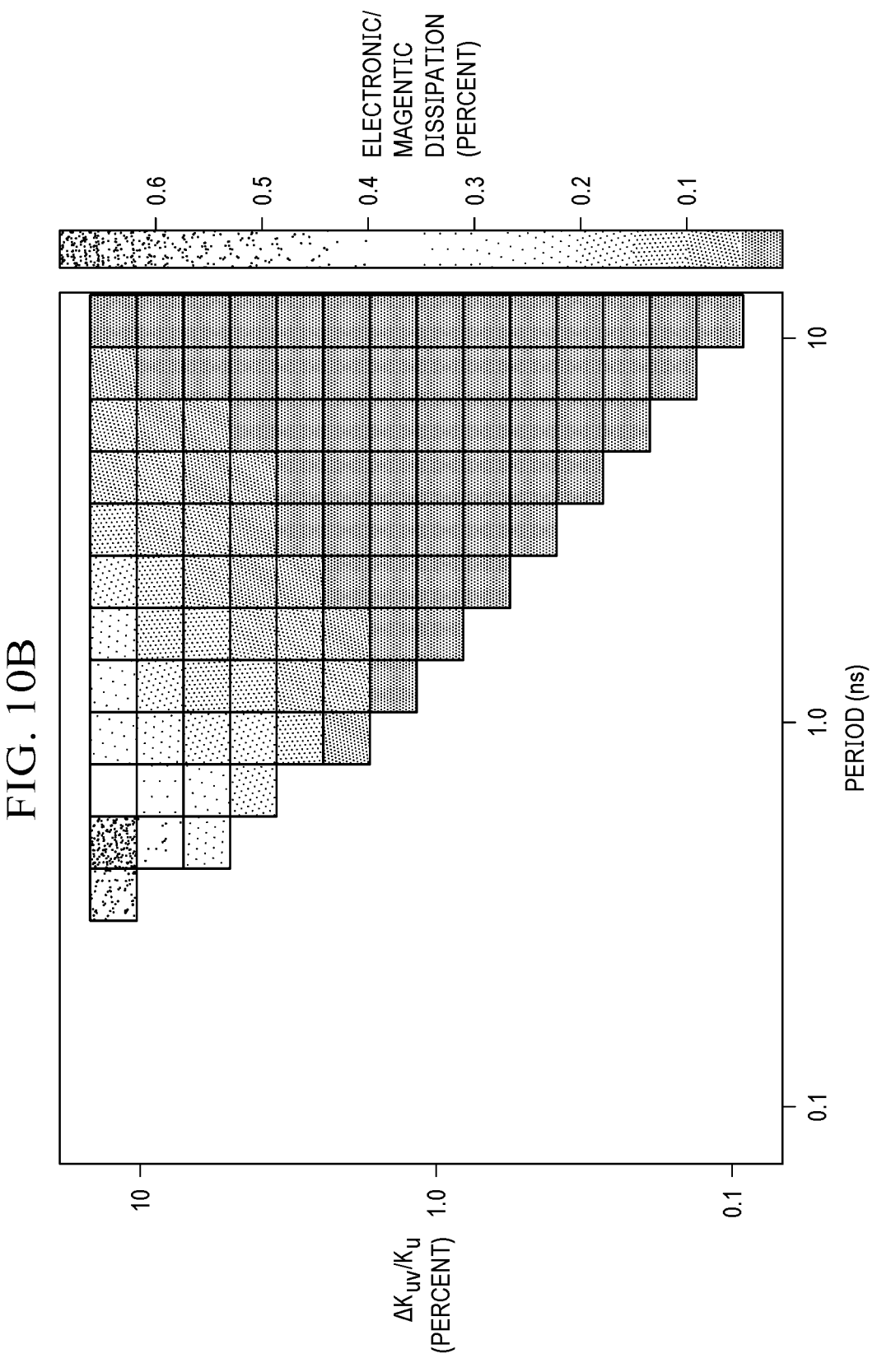
FIG. 10B illustrates the ratio of magnetic and electronic dissipation for a skyrmion wire.

By implementing this equation in mumax3, the magnetic dissipation was calculated for all simulations. A 3D model for the AND/OR device was modeled using COMSOL (FIGS. 10A and 10B); for a range of temperatures, frequencies, and voltages, the Ohmic losses of the device were calculated to estimate electronic dissipation. The electronic structure of the clocking circuit comprises several staggered wires and electrodes, which minimize capacitive coupling and power. By pairing the LC (inductor and capacitor)

parameters of the circuit to a physical or electronic resonator, the charge can be preserved with minimal energy overhead. As shown in FIGS. 10A and 10B, the magnetic dissipation dominates the electronic dissipation due to the recycling of charge inherent to the three-phase sinusoidal clocking scheme.

Figure 11:
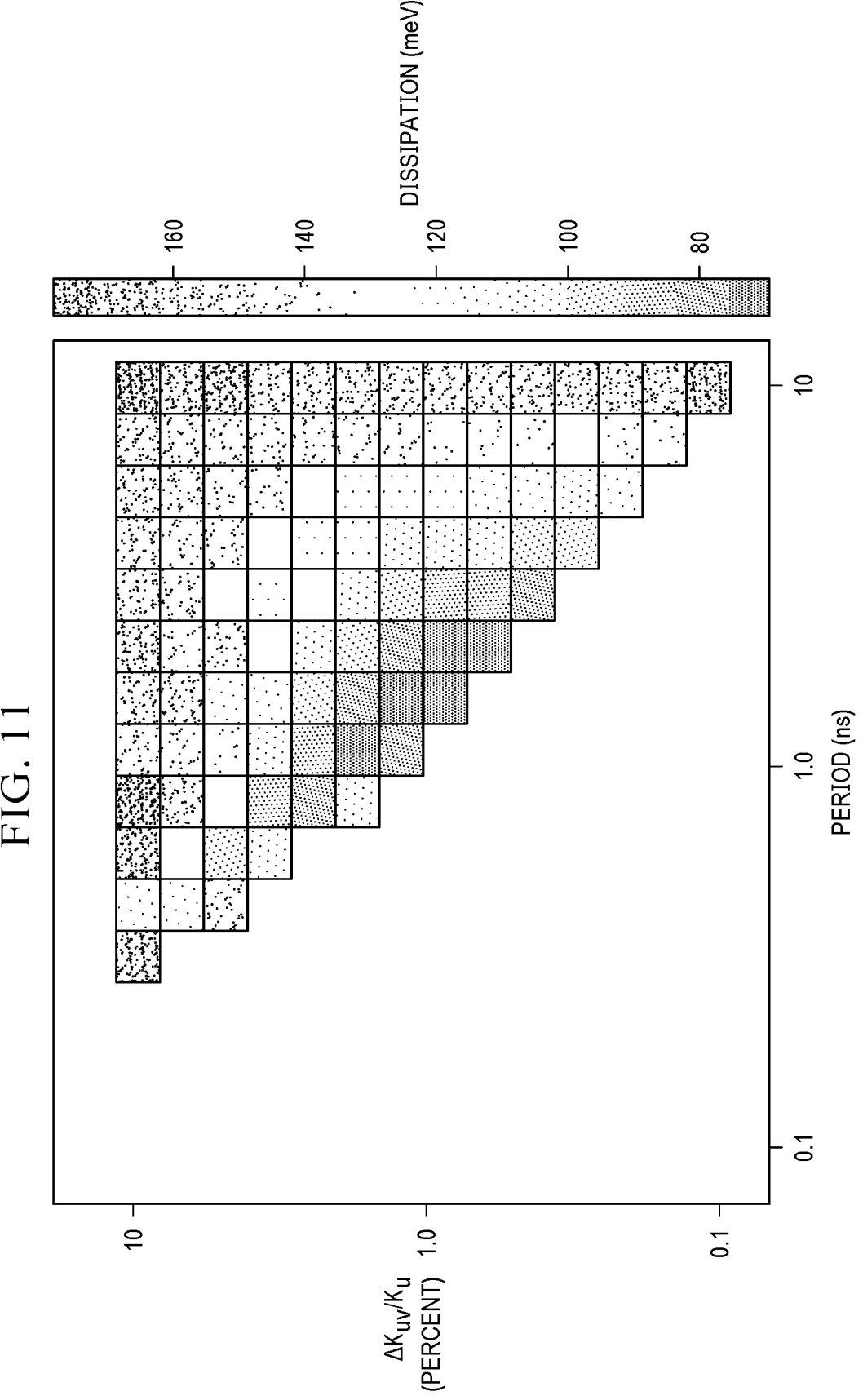
FIG. 11 illustrates a dissipation heatmap for a skyrmion in a 60 nm long wire.
Figure 12C:
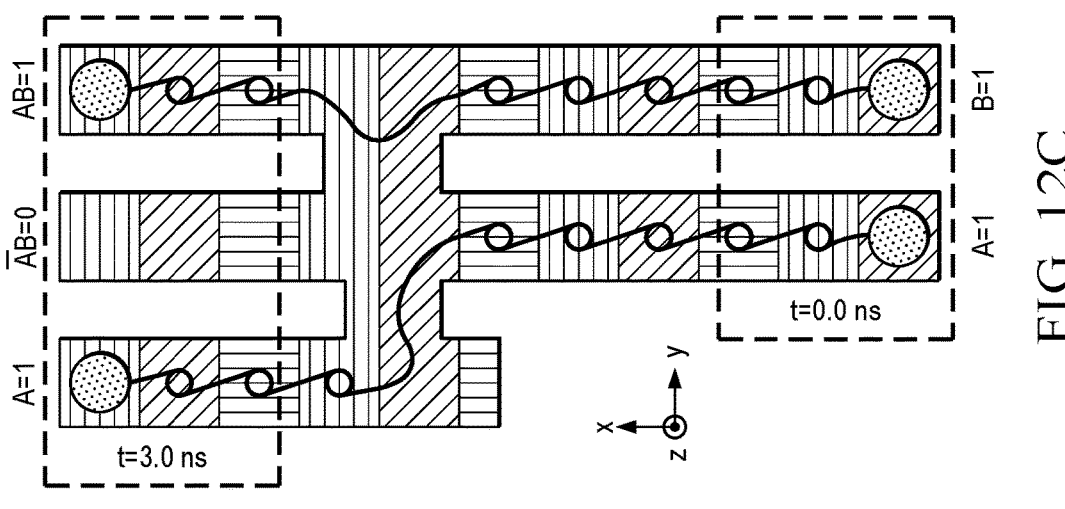
FIG. 12C illustrates micromagnetic simulation results for Ressler-Feynman switch gate using voltage-based propagation wherein A=B=1.
Figure 12B:
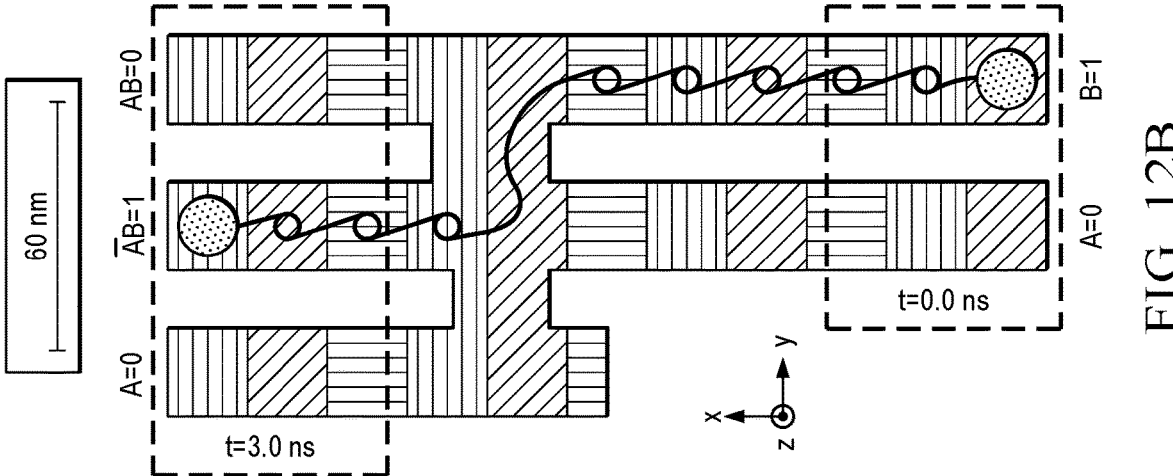
FIG. 12B illustrates micromagnetic simulation results for Ressler-Feynman switch gate using voltage-based propagation wherein A=0, B=1.
Figure 12A:
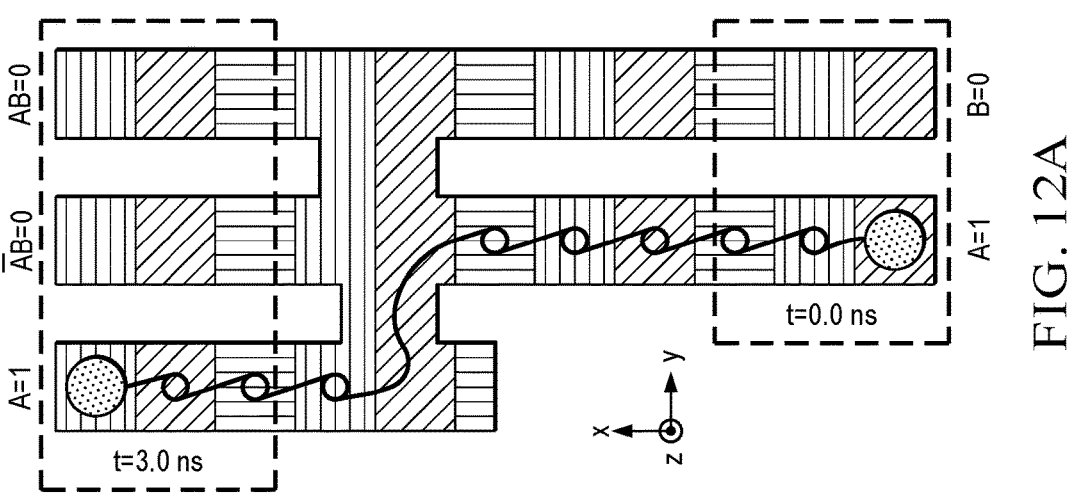
FIG. 12A illustrates micromagnetic simulation results for Ressler-Feynman switch gate using voltage-based propagation wherein A=1, B=0.
Figure 12F:
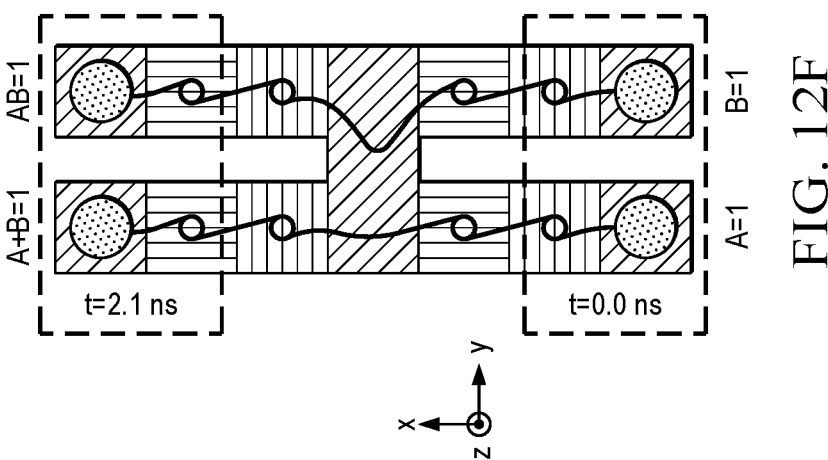
FIG. 12F illustrates micromagnetic simulation results for an AND/OR gate using voltage-based propagation wherein A=B=1.
Figure 12E:
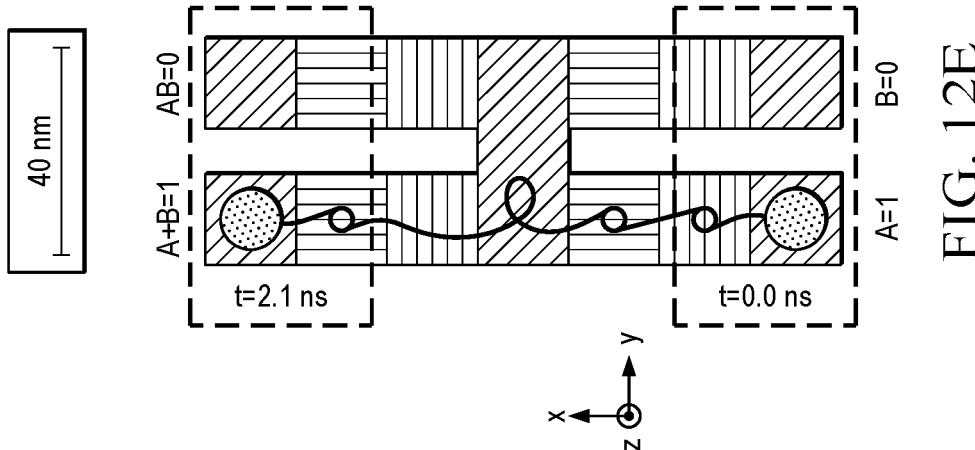
FIG. 12E illustrates micromagnetic simulation results for an AND/OR gate using voltage-based propagation wherein A=1, B=0.
Figure 12D:
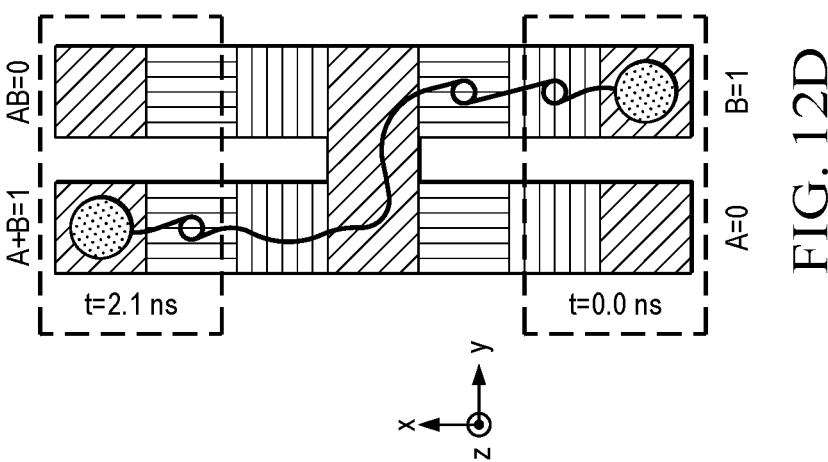
FIG. 12D illustrates micromagnetic simulation results for an AND/OR gate using voltage-based propagation wherein A=0, B=1.
Figure 12G:
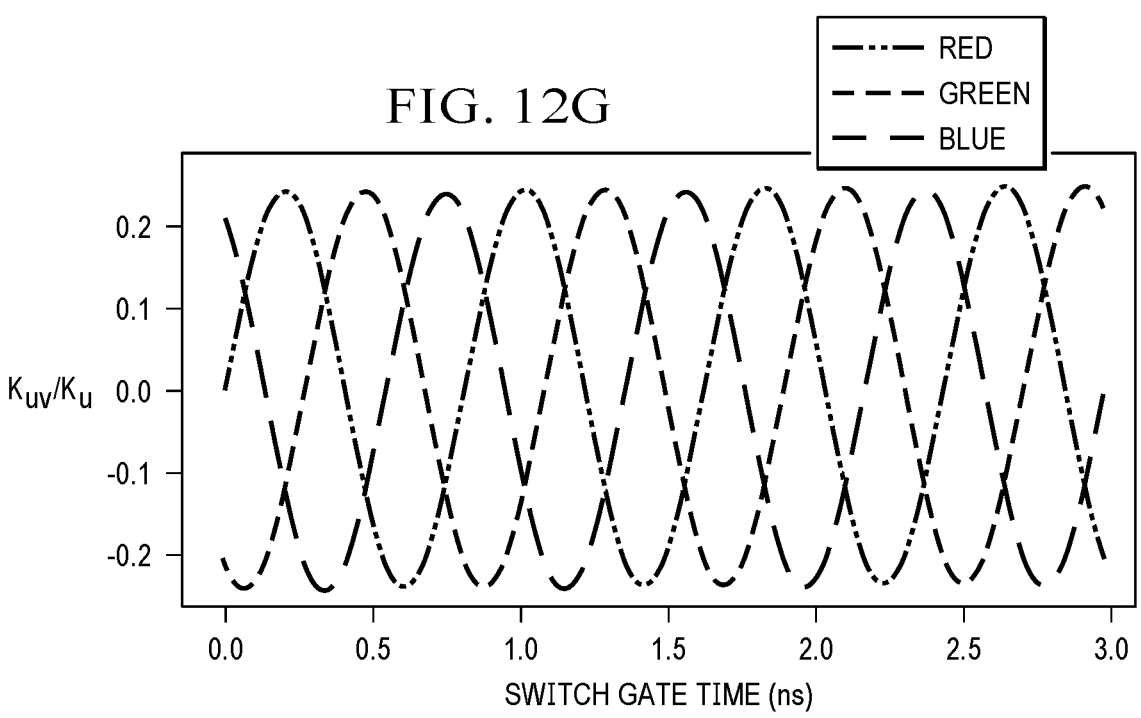
FIG. 12G illustrates anisotropy-modulating voltage waveform applied to each VCMA region for a Ressler-Feynman switch gate wherein ΔKuv/Kv is the relative change in PMA between when voltage is applied and the baseline anisotropy.
Figure 12H:
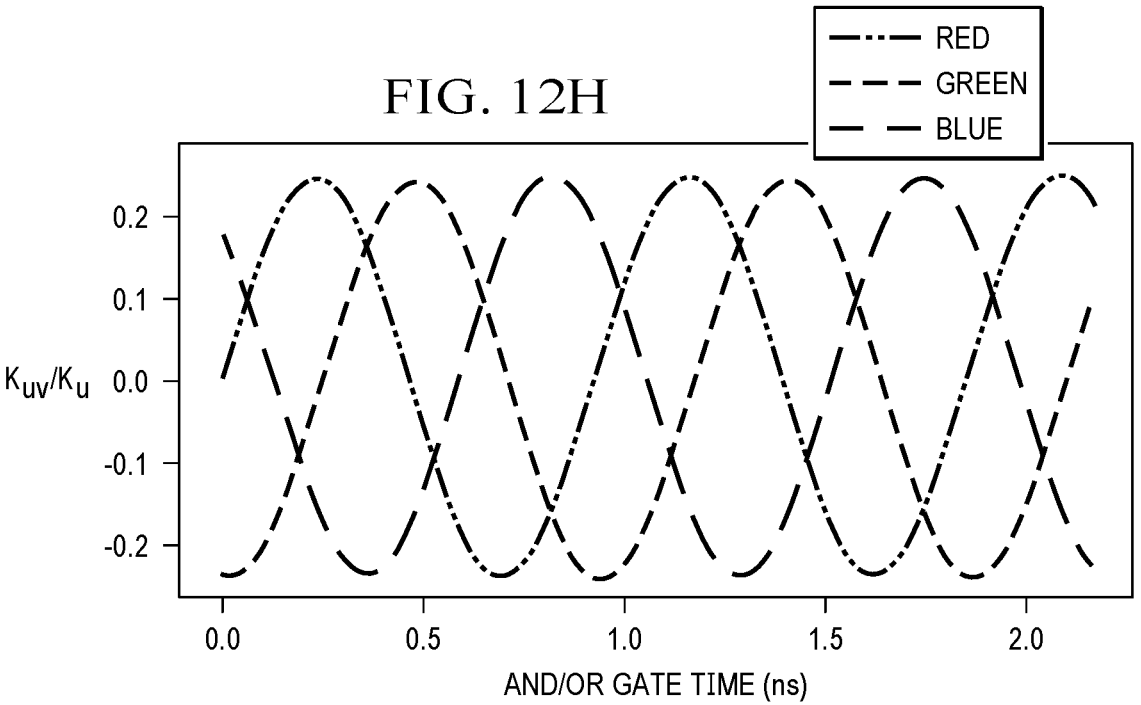
FIG. 12H illustrates anisotropy-modulating voltage waveform applied to each VCMA region for an AND/OR gate wherein ΔKuv/Kv is the relative change in PMA between when voltage is applied and the baseline anisotropy

FIG. 11 shows the relationship between circuit parameters and the functionality and efficiency of the propagation scheme. Because skyrmion acceleration increases with PMA gradient, large anisotropy increases result in shorter acceleration times. Therefore, as the effective anisotropy is increased, the period can be decreased while allowing for proper propagation. While electronic dissipation is inversely proportional to the square of period, the micromagnetic dissipation dominates the dissipation, being proportional to the period. Further, both electronic and magnetic dissipation increase with increased PMA strength. Therefore, there should be an optimal value where both PMA and period are minimized such that the circuit operates with minimum total dissipation.

At this optimal value, the skyrmion wire dissipates 80 meV per 60 nm, for a unit dissipation of 0.214 pJ/m. This represents a decrease in electrical energy consumption of ~8,000× relative to square wave clocking of and ~50× compared to current-driven propagation. Further, this scheme has a throughput of 1 Gbps at peak efficiency, for an 1,800× increase in data transfer efficiency (Mbps/W) compared to some earlier schemes.

By integrating this highly-efficient VCMA-driven propagation into a reversible logic scheme, the energy dissipation is far smaller than that required with current-driven propagation. FIGS. 12A-12H show the operation of a Ressler-Feynman switch gate and an AND/OR gate, where three clock cycles bring the skyrmions to their respective outputs for the switch gate and two are required for the AND/OR switch gate. This VCMA-driven system circumvents the need for synchronizers, as skyrmion position is directly controlled by the propagation clock.

The AND/OR gate is logically reversible only for the subset of input combinations with two or zero skyrmions; with one skyrmion, it is impossible to recover the inputs. However, the Ressler-Feynman gate is fully logically reversible for all input combinations. The reverse Ressler-Feynman gate is also logically reversible for the subset of outputs produced by the forwards Ressler-Feynman gate. However, the Ressler-Feynman gate remains physically irreversible, as the reverse trajectories differ from the forward ones. This hysteresis creates entropy and increases dissipation, preventing sub-Landauer computation.

Figure 13:
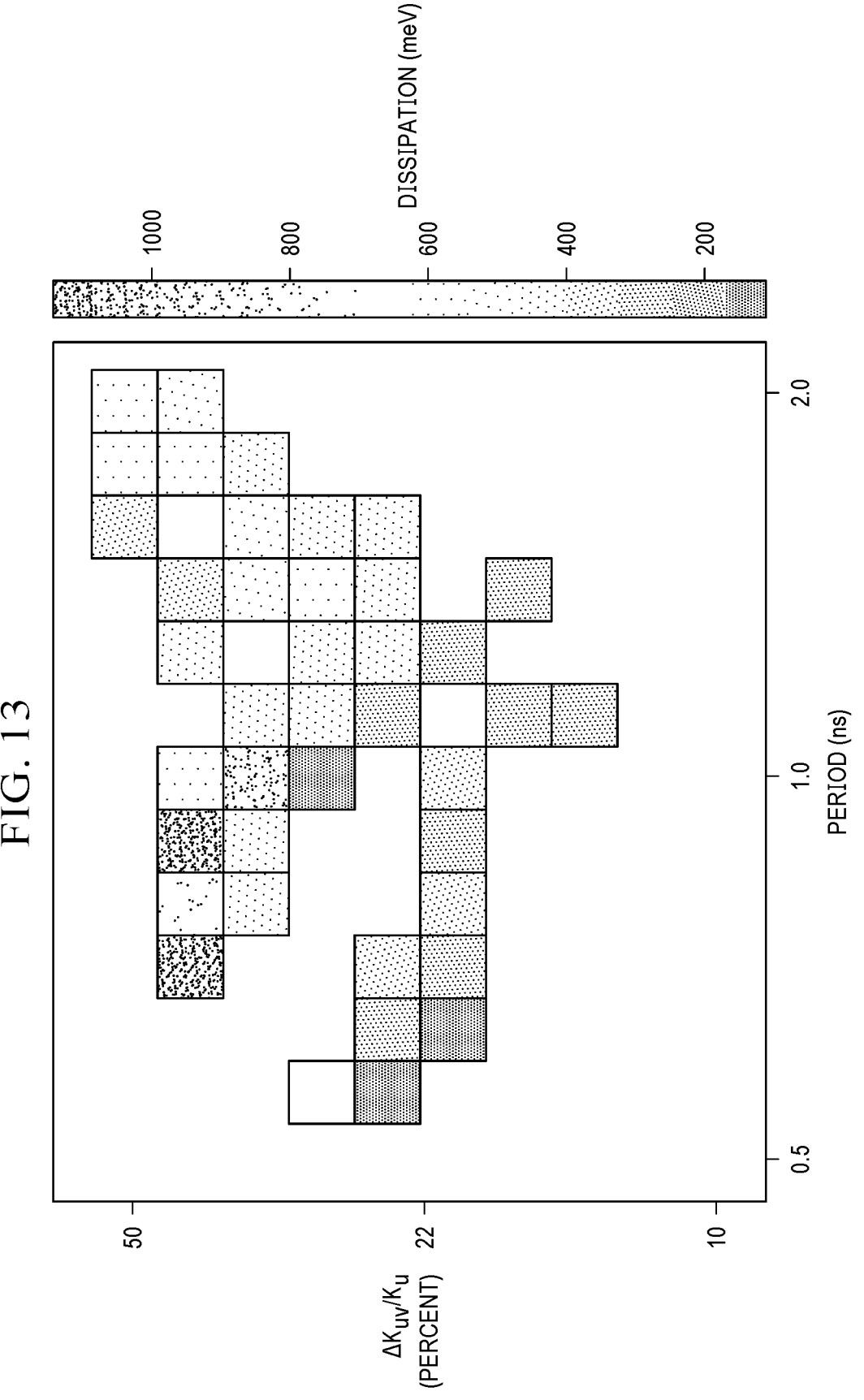
FIG. 13 illustrates a dissipation heatmap for a skyrmion AND/OR gate.

As shown in FIG. 13, the heatmap for the AND/OR gate is more complicated than that of the skyrmion wire. Rather than a linear relationship between period and PMA, the AND/OR gate is far more complex. Firstly, the period cannot be larger than 2 ns, as the skyrmion will not have enough velocity to exhibit the skyrmion-Hall force to interact in the logic gate. The dependence on the skyrmion-Hall force prevents arbitrarily slow computation. Next, there are a few ideal bands where the period and PMA strength correlate for proper logical operation. Similarly to the skyrmion wire, magnetic dissipation dominates, where increasing period and PMA strength results in increased dissipation.

Figure 14:
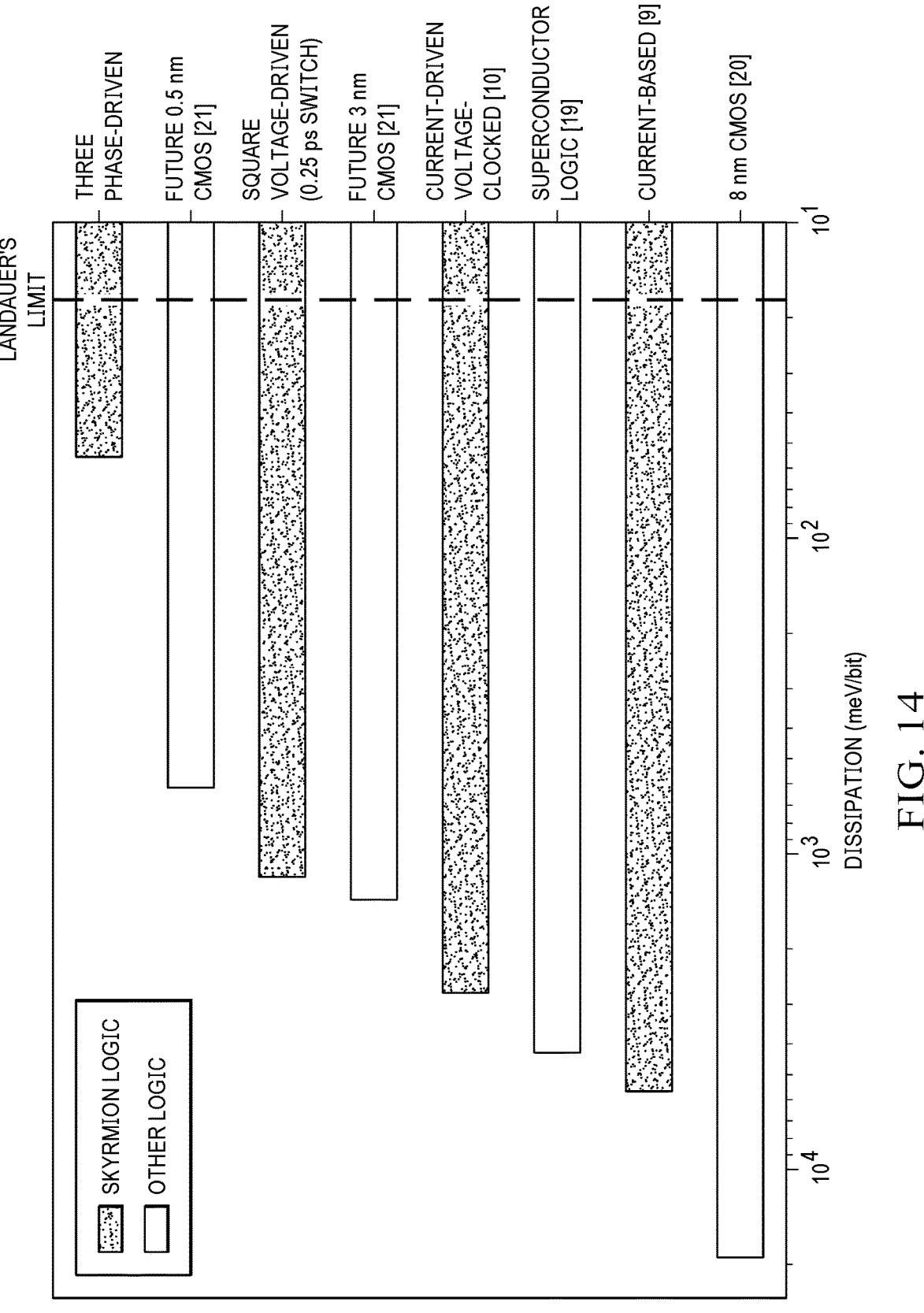
FIG. 14 illustrates a comparison of total dissipation per bit processed for skyrmion logic technologies and other logic technologies.

The system can run from ~100 MHz to ~1 GHz, with minimum average dissipation of 102 meV/operation. While the micromagnetic simulations were performed at 0 K, the minimum dissipation is ~6× the Landauer limit at room temperature. As the skyrmion dynamics are not physically reversible, this dissipation remains above the minimum predicted by Landauer. As illustrated in FIG. 14, this is ~9,000× lower than 8 nm CMOS and ~80× lower than superconductive logic, demonstrating the viability of voltage-based skyrmion logic as a low-energy computation scheme.

The proposed three-phase VCMA-driven skyrmion propagation is far more efficient than previous alternatives. Implementing this propagation mechanism into the reversible skyrmion computing system results in a dissipation only ~6× that of the room temperature Landauer limit. This represents a massive step forward in skyrmion logic efficiency.

The major obstacles preventing the scheme from computing below the Landauer limit are the lack of physical reversibility and insufficient adiabaticity. The logically reversible Ressler-Feynman Switch gate is not physically reversible, as the return paths of the outputs are not identical to that of the inputs. This results in hysteresis and the necessary generation of entropy, wholly preventing sub-Landauer dissipation. Further, there are inefficiencies such as the loops in the skyrmion trajectories which worsen adiabaticity. Once true physical reversibility is achieved, improvements to efficiency could result in sub-Landauer computation with skyrmion logic.

FIG. 15 illustrates a process flow for skyrmion based processing in accordance with an illustrative embodiment.

Skyrmions are generated. Their presence or absence represents a binary "1" or "0", respectively (step 1502).

Skyrmions are moved down the racetrack using a multiphase VCMA clock (step 1504).

When zero or more skyrmions belonging to the same clock cycle meet at a logical junction, the VCMA propagation allows them to interact, performing various logical operations (step 1506). Zero skyrmions represent binary "0"s entering the logical junction.

Following the logic, the outputs fanout to other logic gates, allowing for the computation of any arbitrary combinatorial function (step 1508).

After the desired computation is complete, the presence of the skyrmions can be read via magnetic tunnel junctions (step 1510).

Figure 16:
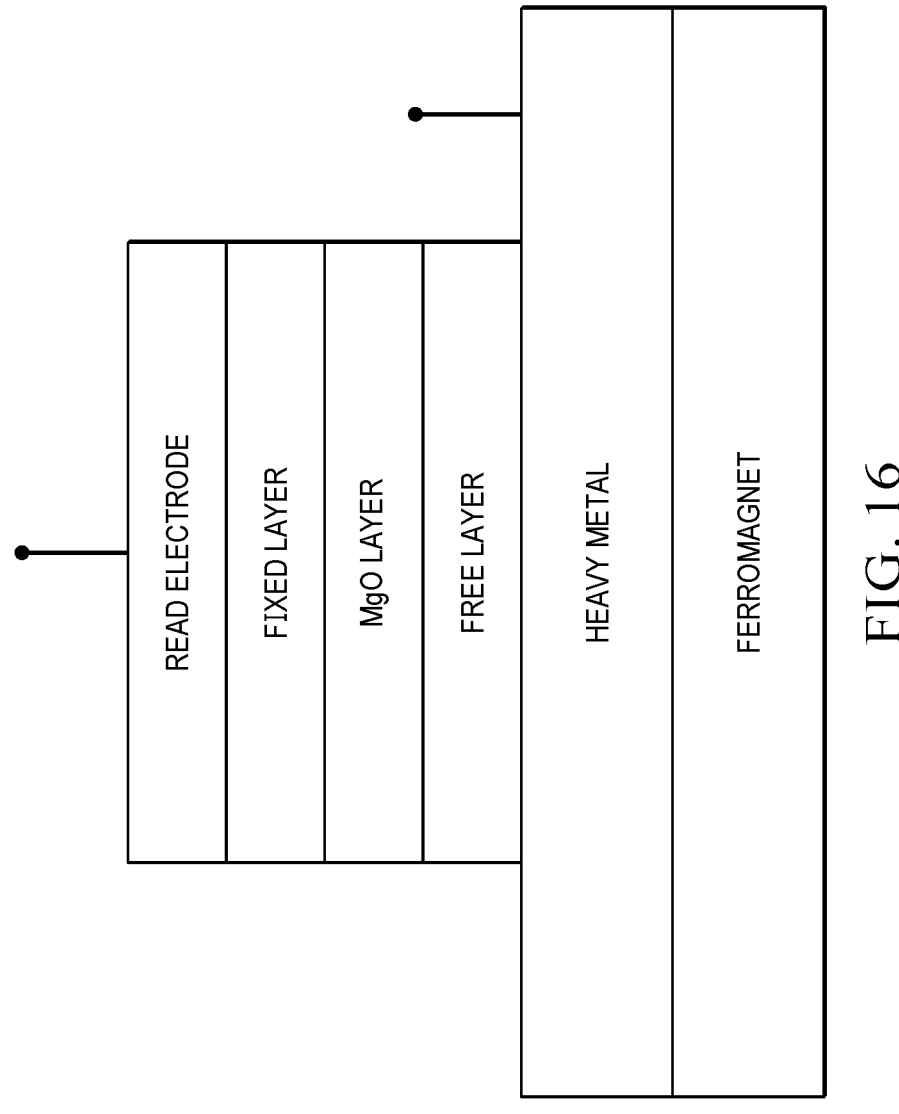
FIG. 16 illustrates a detailed view of a magnetic tunnel junction in accordance with an illustrative embodiment.

FIG. 16 illustrates a detailed view of the magnetic tunnel junction shown in step 1510 in FIG. 15 in accordance with an illustrative embodiment.

Figure 17:
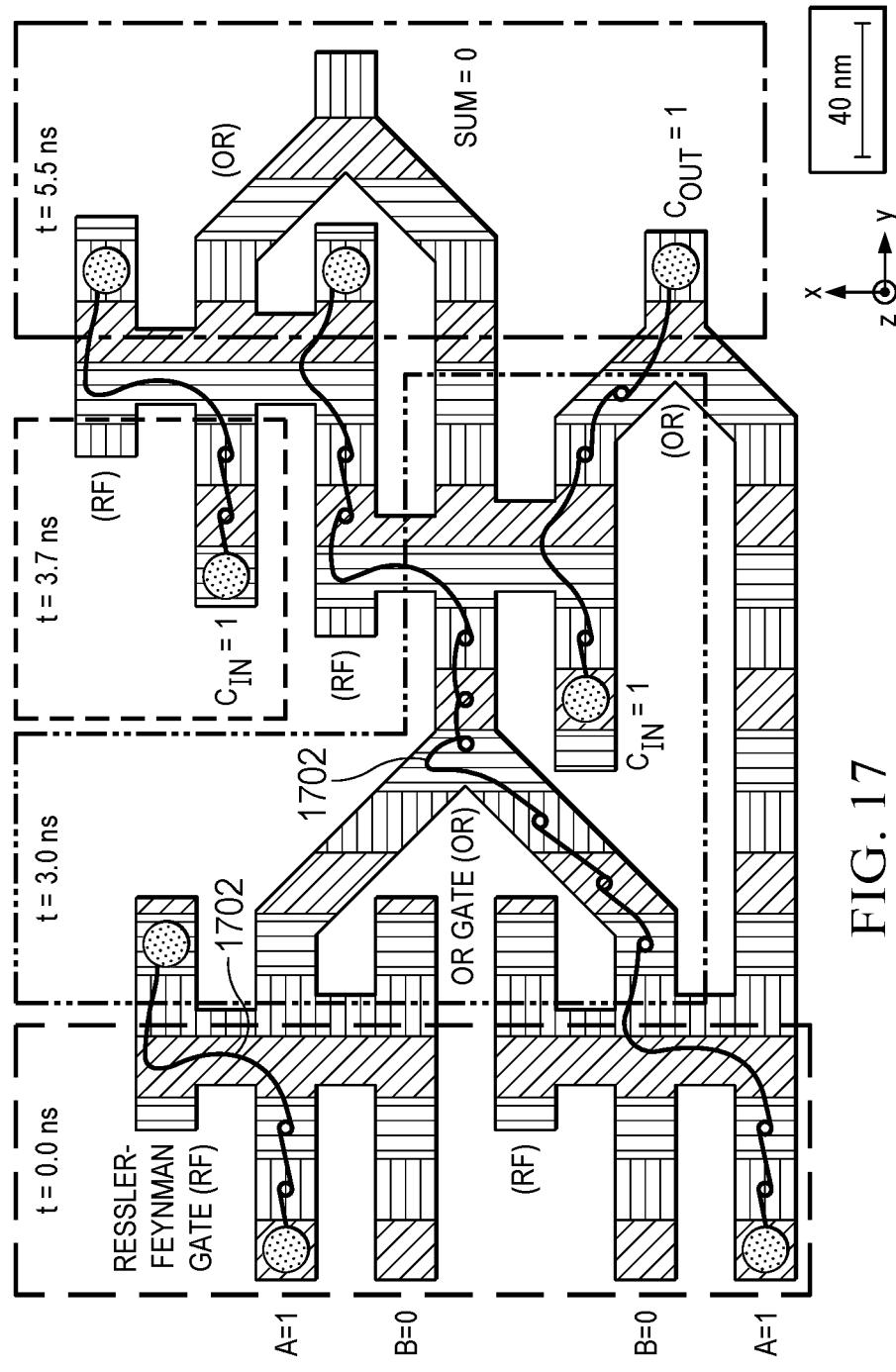
FIG. 17 illustrates a VCMA one-bit full adder circuit in accordance with an illustrative embodiment.

FIG. 17 illustrates a VCMA one-bit full adder circuit in accordance with an illustrative embodiment. The present example illustrates one-bit full adder simulation results for input combination ($A=1$, $B=0$, $Ci_n=1$). Skyrmions are inputted at $t=0.0$ ns and are propagated according to the respective VCMA (shaded) regions, with their trajectory shown by connector lines 1702. At $t=3.0$ and $t=3.7$ ns, the carry-in skyrmions are released into the computation. At $t=5.5$ ns, the skyrmions reach the end of the circuit. This circuit includes multiple Ressler-Feynman and OR gates.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item B. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

The descriptions of the various embodiments of the present invention have been presented for purposes of illustration, but are not intended to be exhaustive nor is the present invention limited to the embodiments disclosed. Many modifications and variations will be apparent to those of ordinary skill in the art without departing from the scope and spirit of the described embodiment. The terminology used herein was chosen to best explain the principles of the embodiments, the practical application or technical improvement over technologies found in the marketplace, or to enable others of ordinary skill in the art to understand the embodiments disclosed here.

Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for skyrmion based processing, the method comprising:
generating a number of skyrmions;
driving, by a multi-phase voltage-controlled magnetic anisotropy (VCMA) clock, the skyrmions down a skyrmion racetrack in a logic gate;
performing a number of logical operations with zero or more skyrmions belonging to the same clock cycle that meet at a logical junction; and
sending outputs of the logical operations to other logic gates for computation of any arbitrary combinatorial function.

2. The method of claim 1, wherein the presence of a skyrmion represents a binary 1, and where the absence of a skyrmion represents a binary 0.

3. The method of claim 1, further comprising:
after computing the combinatorial function, reading, via a magnetic tunnel junction, the presence of the skyrmions.

4. The method of claim 1, wherein the logic gate is configured for both AND and OR operations.

5. The method of claim 1, wherein skyrmions in a first track move through the logical junction to a second track due to a skyrmion-Hall force in a direction from the first track to the second track.

6. The method of claim 5, wherein movement of skyrmions through the logical junction is influenced by the presence of other skyrmions at an intersection of the logical junction and a second track, resulting from skyrmion-skyrmion repulsion that counteracts the skyrmion-Hall force.

7. The method of claim 1, further comprising synchronizing the skyrmions with one another by the anisotropy voltage waveforms as the skyrmions enter the logic gates, thereby providing skyrmion-skyrmion repulsion at logic gate junctions to ensure logical functionality.

8. The method of claim 1, further comprising recycling charge among gate voltages used in the multi-phase clock.

9. The method of claim 1, wherein the logic gate is configured to perform at least one of:
inversion;
duplication;
AND;

OR; or

Ressler-Feynman switch gate function.

10. The method of claim 1, wherein all input skyrmions entering the logic gate exit the logic gate as outputs.

11. A logic gate, comprising:

a number of tracks configured for propagation of magnetic skyrmions;

a number of junctions linking the tracks; and a multi-phase voltage-controlled magnetic anisotropy (VCMA) clock that drives skyrmions down at least one of the tracks.

12. The logic gate of claim 11, wherein the presence of a skyrmion represents a binary 1, and where the absence of a skyrmion represents a binary 0.

13. The logic gate of claim 11, wherein the logic gate is configured for both AND and OR operations.

14. The logic gate of claim 11, wherein skyrmions in a first of the tracks move through one the junctions to a second of the tracks due to a skyrmion-Hall force in a direction from the first track to the second track.

15. The logic gate of claim 14, wherein movement of skyrmions through the junction is influenced by the presence of other skyrmions at an intersection of the junction and second track, resulting from skyrmion-skyrmion repulsion that counteracts the skyrmion-Hall force.

16. A logic circuit, comprising:

a number of skyrmion logic gates, wherein each skyrmion logic gate comprises:

a number of tracks configured for propagation of magnetic skyrmions;

a number of junctions linking the tracks; and a multi-phase voltage-controlled magnetic anisotropy (VCMA) clock that drives skyrmions down at least one of the tracks in each logic gate, and wherein output skyrmions from logic gates in the circuit act as input skyrmions for other logic gates in the circuit.

17. The logic circuit of claim 16, wherein the presence of a skyrmion represents a binary 1, and where the absence of a skyrmion represents a binary 0.

18. The logic circuit of claim 16, wherein the logic gates are configured for both AND and OR operations.

19. The logic circuit of claim 16, wherein the skyrmions are synchronized with one another by the anisotropy voltage waveforms as the skyrmions enter logic gates, thereby providing skyrmion-skyrmion repulsion at logic gate junctions to ensure logical functionality.

20. The logic circuit of claim 16, further comprising the recycling of charge among gate voltages used in the multiphase clock.

* * * * *